(12) United States Patent
Biwa et al.

(10) Patent No.: US 7,589,346 B2
(45) Date of Patent: Sep. 15, 2009

(54) GAN BASED SEMICONDUCTOR LIGHT-EMITTING DEVICE AND METHOD FOR PRODUCING SAME

(75) Inventors: Goshi Biwa, Kanagawa (JP); Hiroyuki Okuyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 122 days.

(21) Appl. No.: 11/531,141

(22) Filed: Sep. 12, 2006

(65) Prior Publication Data

US 2009/0206325 A1 Aug. 20, 2009

(30) Foreign Application Priority Data

Sep. 13, 2005 (JP) ............................. 2005-264935

(51) Int. Cl.
*H01L 33/00* (2006.01)
(52) U.S. Cl. .................. 257/13; 257/E33.034; 257/22; 257/97
(58) Field of Classification Search ..................... 257/13
See application file for complete search history.

(56) References Cited

U.S. PATENT DOCUMENTS

| | | | |
|---|---|---|---|
| 6,635,904 B2 | 10/2003 | Goetz et al. | |
| 2001/0028668 A1* | 10/2001 | Fukunaga et al. | 372/46 |
| 2002/0175341 A1 | 11/2002 | Biwa et al. | |

FOREIGN PATENT DOCUMENTS

JP 2002-319702 10/2002

OTHER PUBLICATIONS

Akasaka et al., "High luminescent efficiency of InGaN multiple quantum wells grown on InGaN underlying layers," Applied Physics Letters, vol. 85, pp. 3089-3091, 2004.
Kumakura et al., "Efficient Hole Generation above 10(19) cm(-3) in Mg-Doped InGaN/GaN Superlattices at Room Temperature," J. Appl. Phys. , vol. 39, 2000, http//jjap.ipap.jp/journal/html/JJAP-39-3A/L195/article.html.
Kumakara et al., "Increased Electrical Activity of Mg-Acceptors in AlxGa1-xN/GaN Superlattices," J. Appl. Phys. , vol. 38, 1999, http//jjap.ipap.jp/journal/html/JJAP-38-9A/L1012/article.html.
Hull et al., "Influence of oxygen on the activation of p-type GaN," Applied Physics Letters, vol. 76, pp. 2271-2273, 2000.
Kozodoy et al., "Polarization-enhanced Mg doping of AlGaN/GaN superlattices," Applied Physics Letter, vol. 75, pp. 2444-2246, 1999.
Kozodoy et al., "Enhance Mg doping efficiency in Al0.2Ga0.8N/GaN superlattices," Applied Physics Letter, vol. 74, pp. 3681-3683, 1999.
Nikishin et al., "Deep Ultraviolet Light Emitting Diodes Based on Short Period Superlattices of AlN/AlGa(ln)N," Jpn. J. Appl. Phys., vol. 42, pp. L1362-L1365, 2003.

* cited by examiner

*Primary Examiner*—Jerome Jackson, Jr.
(74) *Attorney, Agent, or Firm*—K&L Gates LLP

(57) ABSTRACT

A GaN based semiconductor light-emitting device is provided. The light-emitting device includes a first GaN based compound semiconductor layer of an n-conductivity type; an active layer; a second GaN based compound semiconductor layer; an underlying layer composed of a GaN based compound semiconductor, the underlying layer being disposed between the first GaN based compound semiconductor layer and the active layer; and a superlattice layer composed of a GaN based compound semiconductor doped with a p-type dopant, the superlattice layer being disposed between the active layer and the second GaN based compound semiconductor layer.

10 Claims, 29 Drawing Sheets

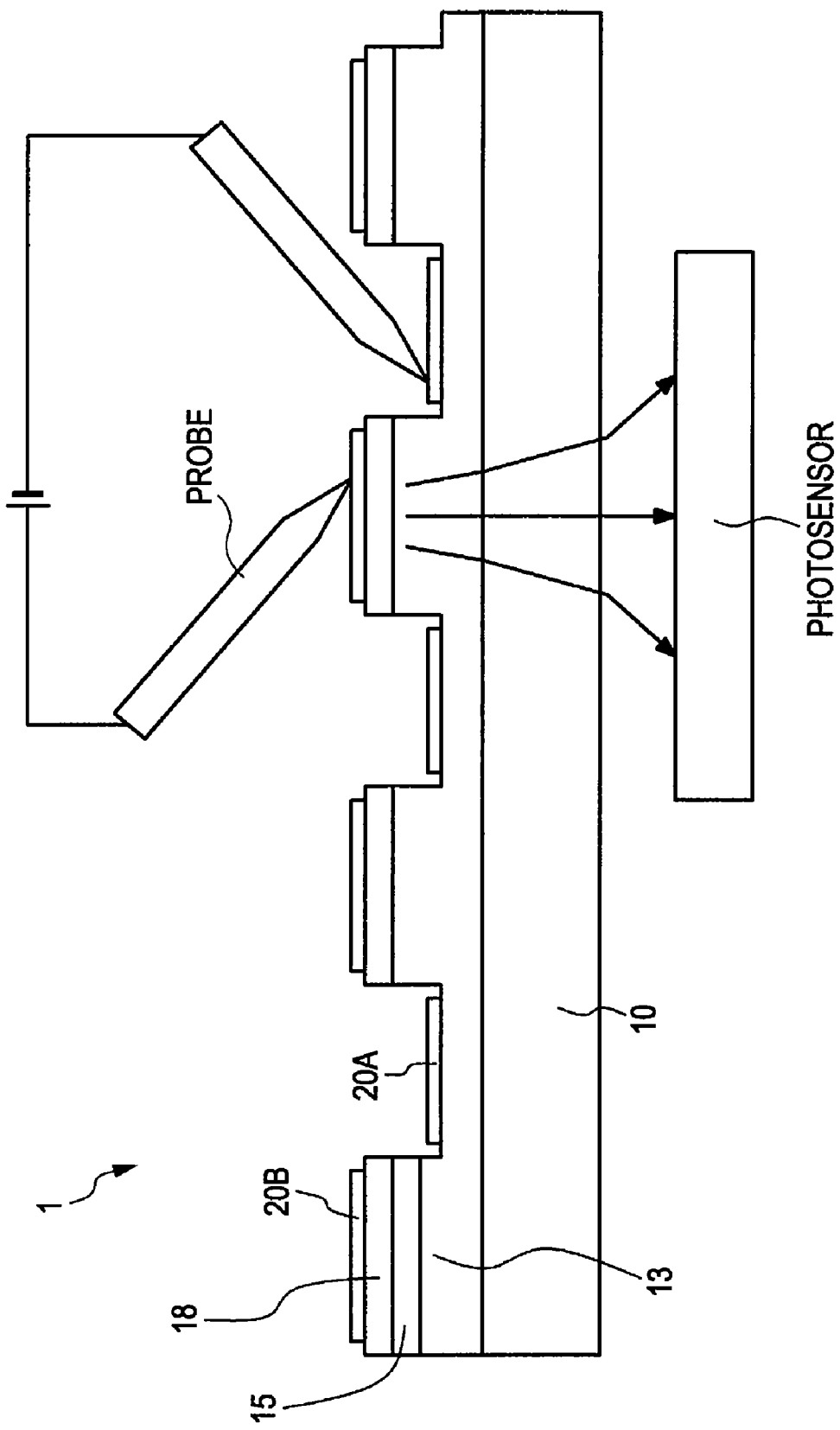

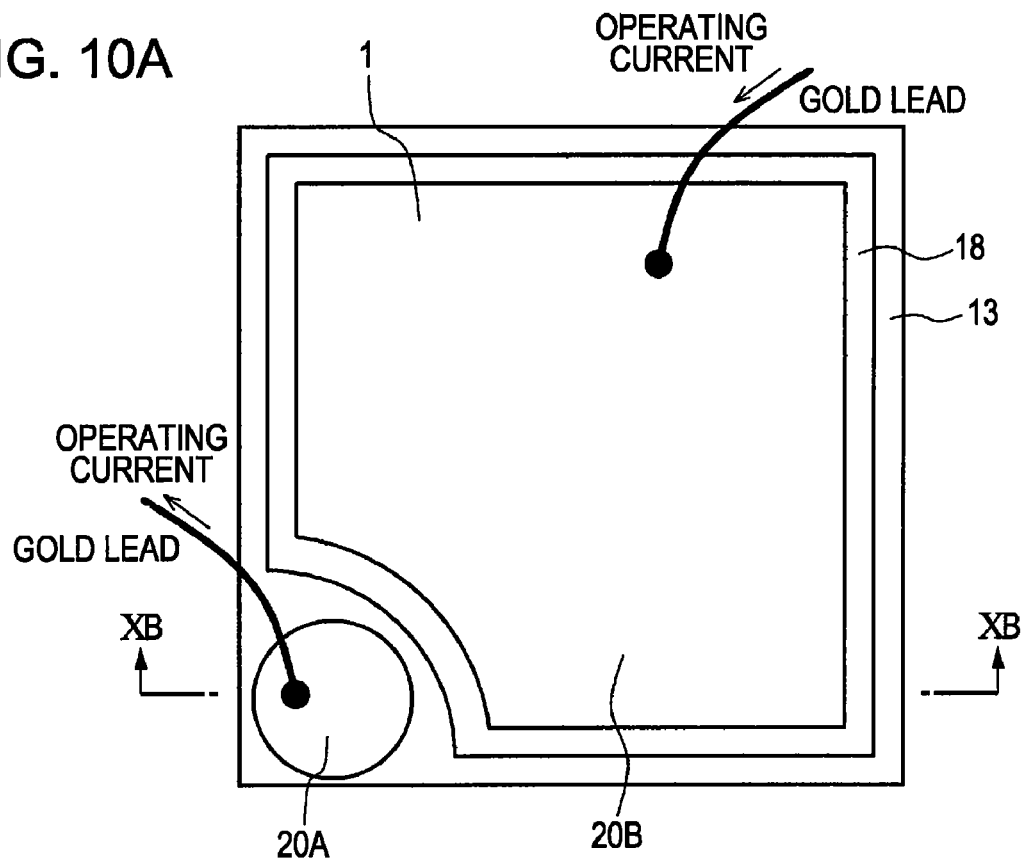
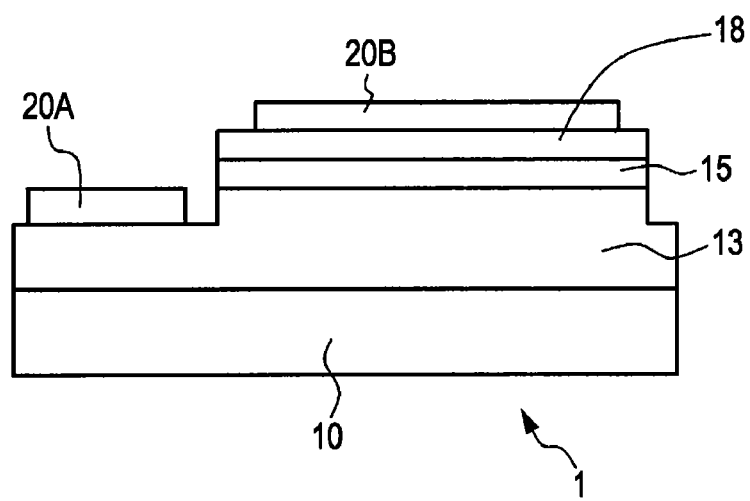

GAN BASED SEMICONDUCTOR LIGHT-EMITTING DEVICE AND METHOD FOR PRODUCING SAME

CROSS REFERENCES TO RELATED APPLICATIONS

The present application claims priority to Japanese Patent Application JP 2005-264935 filed in the Japanese Patent Office on Sep. 13, 2005, the entire contents of which are incorporated herein by reference.

BACKGROUND

The present disclosure relates to a gallium nitride (GaN) based semiconductor light-emitting device and a method for producing the same.

In light-emitting devices (GaN based semiconductor light-emitting devices) including an active layer composed of gallium nitride compound semiconductor, control of the band gap energy by means of the (alloy) composition and the thickness of the active layer results in a wide emission wavelength range from ultraviolet to infrared. GaN based semiconductor light-emitting devices, such as light-emitting diodes (LEDs), that emit light rays of various colors are already commercially available and used for wide applications, such as image displays, luminaries, inspection apparatuses, and sterilizing light sources. Furthermore, blue-violet semiconductor lasers have also been developed and used as pickups for reading and writing of large-capacity optical discs.

A typical GaN based semiconductor light-emitting device has a structure of a first GaN based compound semiconductor layer with an n-type conductivity, an active layer, and a second GaN based compound semiconductor layer with a p-type conductivity stacked in that order on a substrate.

In such a GaN based semiconductor light-emitting device, U.S. Pat. No. 6,635,904 B2 discloses a technique in which a smoothing layer is formed by crystal growth between an active layer and a first GaN based compound semiconductor layer. The formation of the smoothing layer significantly improves characteristics. A similar report discloses that the formation of an InGaN layer having an In content of about 0.04 and functioning as an underlying layer of an active layer that has a quantum well structure and that emits blue-violet light increases photoluminescence efficiency to 70%, which have been 30% to 40% in the past (see, T. Akasaka, H. Gotoh, T. Saito, and T. Makimoto, Appl. Phys. Lett., vol. 85, pp. 3089-3091 (2004)).

It has been known that a technique for the formation of a second GaN based compound semiconductor layer above an active layer having a superlattice subjected to uniform or modulation doping, the superlattice containing a Mg-doped AlGaN sublayer and a Mg-doped GaN sublayer. The formation of the second GaN based compound semiconductor layer having the superlattice increases hole concentration (for example, see K. Kumakura and N. Kobayashi, Jpn. J. Appl. Phys. vol. 38 (1999) pp. L1012; P. Kozodoy et al., Appl. Phys. Lett. 75, 2444 (1999); and P. Kozodoy et al., Appl. Phys. Lett. 74, 3681 (1999)). This technique is one in which high hole concentration is two-dimensionally obtained on the basis of the piezoelectric effect due to strain. Furthermore, it is possible to obtain the effect on conduction in the second GaN based compound semiconductor layer in the thickness direction, i.e., it is possible to reduce series resistance, by optimization of the superlattice period.

GaN based semiconductor light-emitting devices may be required to achieve high luminous efficiency in operation at a high operating current density (for example, an operating current density of 50 A/cm$^2$ to 100 A/cm$^2$ or more) and to achieve a significant reduction in operation voltage. However, none of the references describe specific means and measures for achieving such demands.

It is desirable to provide a GaN based semiconductor light-emitting device having a structure providing high luminous efficiency in operation at a high operation current density and a significant reduction in operation voltage. Furthermore, it is desirable to provide a method for producing the GaN based semiconductor light-emitting device.

SUMMARY

According to a first embodiment, there is provided a GaN based semiconductor light-emitting device including:

(A) a first GaN based compound semiconductor layer of an n-conductivity type;

(B) an active layer;

(C) a second GaN based compound semiconductor layer;

(D) an underlying layer composed of a GaN based compound semiconductor, the underlying layer being disposed between the first GaN based compound semiconductor layer and the active layer; and (E) a superlattice layer composed of a GaN based compound semiconductor doped with a p-type dopant, the superlattice layer being disposed between the active layer and the second GaN based compound semiconductor layer.

According to a second embodiment, there is provided a GaN based semiconductor light-emitting device including:

(A) a first GaN based compound semiconductor layer of an n-conductivity type;

(B) an active layer;

(C) a second GaN based compound semiconductor layer of a p-conductivity type; and (D) an underlying layer composed of a GaN based compound semiconductor, the underlying layer being disposed between the first GaN based compound semiconductor layer and the active layer;

wherein the second GaN based compound semiconductor layer has a superlattice.

In the GaN based semiconductor light-emitting device according to the first embodiment, an upper spacer layer composed of an undoped GaN based compound semiconductor is disposed between the active layer and the superlattice layer. The upper spacer layer has a thickness of 100 nm or less and preferably 20 nm or less. In the GaN based semiconductor light-emitting device according to the second embodiment of the present invention, an upper spacer layer composed of an undoped GaN based compound semiconductor is disposed between the active layer and the second GaN based compound semiconductor layer. The upper spacer layer has a thickness of 100 nm or less and preferably 20 nm or less.

In the superlattice layer of the GaN based semiconductor light-emitting device including the above-described preferred structure according to the first embodiment or in the second GaN based compound semiconductor layer including the above-described preferred structure of the GaN based semiconductor light-emitting device according to the second embodiment, (hereinafter, for the sake of convenience, these layers are referred to as "superlattice layer or the like"), the superlattice layer has a thickness of 5 nm or more and preferably 10 nm or more. The second GaN based compound semiconductor layer has a thickness of 5 nm or more, preferably 20 nm or more, and more preferably 50 nm or more, in view of the prevention of the occurrence of a short circuit and the protection of the active layer. For example, the upper limit of the superlattice layer or the like is 0.5 µm to 1 µm. The superlattice of the superlattice layer or the like has a period of two atomic layers to 20 nm and preferably 2 nm to 10 nm. The superlattice layer or the like has a p-type doping concentration of $1\times10^{18}/cm^3$ to $4\times10^{20}/cm^3$ and preferably $1\times10^{19}/cm^3$ to $2\times10^{20}/cm^3$. A structure in which part of the superlattice layer or the like is periodically doped with the p-type dopant may be used.

In the GaN based semiconductor light-emitting device including the above-described preferred structure according to the first or second embodiments, the superlattice layer or the like may have a periodically stacked structure of an AlGaN sublayer and a GaN sublayer. The AlGaN sublayer constituting the superlattice layer or the like has an Al content of 0.05 to 0.4, preferably 0.05 to 0.30, and more preferably 0.10 to 0.25. Alternatively, the superlattice layer or the like may have a periodically stacked structure of an InGaN sublayer and a GaN sublayer. Preferably, the InGaN sublayer constituting the superlattice layer or the like preferably has a smaller In content than the In content of the active layer.

In the GaN based semiconductor light-emitting device according to the first or second embodiment, the superlattice layer or the like directly supplies the active layer with holes. Thus, if the active layer is distant from the superlattice layer or the like, the function and effect of directly supplying the active layer with holes are degraded. Therefore, the effective distance between the superlattice layer or the like and the active layer is 100 nm or less and preferably 20 nm or less. In other words, the upper spacer layer disposed between the superlattice layer or the like and the active layer has, as described above, 100 nm or less and preferably 20 nm or less. If necessary, the superlattice layer or the like may be disposed directly on the active layer without the upper spacer layer.

In the GaN based semiconductor light-emitting device including the above-described preferred structure according to the first or second embodiment, the underlying layer may be in direct contact with the active layer. Alternatively, a structure in which a lower spacer layer composed of an undoped GaN based compound semiconductor and having a thickness of 50 nm or less and preferably 20 nm or less is disposed between the active layer and the underlying layer may be used. The underlying layer has a thickness of 20 nm or more and preferably 50 nm or more. For example, the upper limit of the thickness of the underlying layer is 1 µm. The underlying layer and the active layer each contains In. Preferably, the underlying layer has an In content of 0.005 or more and has a smaller In content than the In content of the active layer. The underlying layer contains an n-type dopant, such as Si. The n-type dopant concentration is $1\times10^{16}/cm^3$ to $1\times10^{21}/cm^3$ and preferably $2\times10^{17}/cm^3$ to $2\times10^{19}/cm^3$. The underlying layer may have a structure mainly composed of a single composition or a structure composed of a gradient composition. The underlying layer is preferably transmissive at an emission wavelength.

In the GaN based semiconductor light-emitting device including the above-described preferred structure according to the first or second embodiments, a structure in which an emission wavelength λ is in the range of 430 nm to 480 nm (basically blue emission) may be used. Alternatively, a structure in which the emission wavelength λ is in the range of 500 nm to 550 nm (basically green emission) may be used. Operating current density is preferably 50 A/cm² or more. Alternatively, the operating current density is preferably 100 A/cm² or more.

In the GaN based semiconductor light-emitting device including the above-described preferred structure according to the first or second embodiments (hereinafter, in some cases, collectively referred to as "GaN based semiconductor light-emitting device according to an embodiment"), a contact layer containing In may be disposed on the second GaN based compound semiconductor layer. In this case, to achieve satisfactory contact resistance, the contact layer has an In content of 0.05 or more and preferably 0.1 to 0.2. Furthermore, to suppress light absorption, the contact layer preferably has a smaller In content than the In content of the active layer. The contact layer may be doped with a p-type dopant, such as Mg. Alternatively, the contact layer may not contain any dopant.

In the GaN based semiconductor light-emitting device according to any one of the embodiments, as described above, the active layer may contain an In atom. Specifically, the active layer may be composed of $Al_xGa_{1-x-y}In_yN$ (wherein $x\geq0$, $y>0$, $0<x+y\leq1$). Examples of the first and second GaN based compound semiconductor layers include GaN layers, AlGaN layers, InGaN layers, and AlInGaN layers. Each of the compound semiconductor layers may further contain a boron atom (B), a thallium (Tl) atom, an arsenic (As) atom, a phosphorus (P) atom, or an antimony (Sb) atom. The active layer has a well layer number of 2 or more preferably 4 or more.

In the GaN based semiconductor light-emitting device according to any one of the embodiments, the term "operating current density" of the GaN based semiconductor light-emitting device means a value obtained by dividing the area (junction area) of the active layer by an operating current value. Commercially available GaN based semiconductor light-emitting devices use a variety of types of packaging. Furthermore, the GaN based semiconductor light-emitting devices have different sizes depending on the intended applications and the amount of light and have different standard operating currents depending on the size of the GaN based semiconductor light-emitting device. Thus, it is difficult to make a direct comparison of the device dependence of characteristics on current. In the present disclosure, for generalization, the operating current value is not used, but the operating current density (unit: ampere/cm²) obtained by dividing the area (junction area) of the active layer by an operating current value is used.

Generally, in semiconductor light-emitting devices, each emission wavelength varies with heat generation and a change in temperature when measuring characteristics. Thus, in the present disclosure, the characteristics at substantially room temperature (25° C.) are described. When the heat generation of the GaN based semiconductor light-emitting device is small, no problem occurs in dc-current operation. However, when heat generation is large, it is necessary to employ a method such that the temperature of the GaN based semiconductor light-emitting device, i.e., the junction temperature, does not significantly change from room temperature, for example, a method for measuring the characteristics by pulsed current operation.

The emission wavelength does not refer to a wavelength in a spectrum corresponding to the luminous efficiency of human vision or a dominant wavelength usually used for the expression of a tint but a wavelength at a peak of a power spectrum. Thin-film interference and the like cause light emitted from an active layer to undergo multiple reflections, depending on measurement conditions; hence, an apparent spectrum of periodic fluctuations is observed, in some cases. A spectrum corresponding to light emitted from the active layer without the periodic fluctuations is used.

According to an embodiment o, there is provided a method for producing a GaN based semiconductor light-emitting device according to the first embodiment, the method including:

forming at least a first GaN based compound semiconductor layer of an n-conductivity type, an underlying layer, an active layer, a superlattice layer doped with a p-type dopant, and a second GaN based compound semiconductor layer doped with a p-type dopant stacked in that order on a substrate; and then annealing the resulting epitaxial wafer at 450° C. to 700° C. and preferably 500° C. to 650° C. in a substantially hydrogen-free atmosphere.

According to an embodiment, there is provided a method for producing a GaN based semiconductor light-emitting device according to the second embodiment of the present invention, the method including:

forming at least a first GaN based compound semiconductor layer of an n-conductivity type, an underlying layer, an active layer, and a second GaN based compound semiconductor layer of a p-conductivity type and having a superlattice stacked in that order on a substrate; and then annealing the resulting epitaxial wafer at 450° C. to 700° C. and preferably 500° C. to 650° C. in a substantially hydrogen-free atmosphere.

In the method for producing the GaN based semiconductor light-emitting device according to the first or second embodiment (hereinafter, in some cases, collectively referred to as "method for producing a GaN based semiconductor light-emitting device according to an embodiment"), the atmosphere in annealing is preferably an atmosphere containing an oxygen gas, for example, an atmosphere containing 0.01 to 10 percent by volume of an oxygen gas.

In the method for producing the GaN based semiconductor light-emitting device according to an embodiment, to prevent the occurrence of thermal damage of the active layer, $T_{MAX}<1350-0.75\lambda$ and preferably $T_{MAX}<1250-0.75\lambda$ is satisfied, wherein $T_{MAX}$ represents the maximum growth temperature (° C.) in growing the superlattice layer or the like; and $\lambda$ represents the emission wavelength of the active layer.

In the methods for producing the GaN based semiconductor light-emitting devices including the above-described embodiments, examples of a method for forming various GaN based compound semiconductor layers, such as the first GaN based compound semiconductor layer, the underlying layer, the lower spacer layer, the active layer, the upper spacer layer, the superlattice layer, and the second GaN based compound semiconductor layer, include metal-organic chemical vapor deposition (MOCVD), molecular beam epitaxy (MBE), and hydride vapor phase epitaxy (HVPE) in which halogen contributes to transportation or reaction.

Examples of an organic gallium gas source used in MOCVD include a trimethylgallium (TMG) gas and a triethylgallium (TEG) gas. Examples of a nitrogen gas source include an ammonia gas and a hydrazine gas. In the formation of the GaN based compound semiconductor layer of an n-conductivity type, for example, silicon (Si) may be doped as an n-type impurity (n-type dopant). In the formation of the GaN based compound semiconductor layer of a p-conductivity type, for example, magnesium (Mg) may be doped as a p-type impurity (p-type dopant). When aluminum (Al) or indium (In) is contained as a constituting atom of the GaN based compound semiconductor layer, a trimethylaluminum (TMA) gas may be used as an Al source. A trimethylindium (TMI) gas may be used as an In source. A monosilane gas ($SiH_4$ gas) may be used as a Si source. A cyclopentadienyl-magnesium gas, a methylcyclopentadienylmagnesium gas, or a bis(cyclopentadienyl)magnesium ($Cp_2Mg$) gas may be used as a Mg source. Examples of the n-type impurity (n-type dopant) include Ge, Se, Sn, C, and Ti other than Si. Examples of p-type impurity (p-type dopant) include Zn, Cd, Be, Ca, Ba, and O other than Mg.

A p-type electrode connected to the second GaN based compound semiconductor layer of p-conductivity type (or a p-type electrode disposed on the contact layer) preferably has a single-layer structure or a multilayer structure containing at least one metal selected group consisting of palladium (Pd), platinum (Pt), nickel (Ni), aluminum (Al), titanium (Ti), gold (Au) and silver (Ag). Alternatively, the p-type electrode may be composed of a light-transmitting conductive material, such as indium tin oxide (ITO). Among these compounds, silver (Ag), Ag/Ni, or Ag/Ni/Pt, which can reflect light with high efficiency, is preferably used. On the other hand, an n-type electrode connected to the first GaN based compound semiconductor layer of n-conductivity type preferably has a single-layer structure or a multilayer structure containing at least one metal selected from the group consisting of gold (Au), silver (Ag), palladium (Pd), aluminum (Al), titanium (Ti), tungsten (W), copper (Cu), zinc (Zn), tin (Sn), and indium (In). Examples of the material of the n-type electrode include Ti/Au, Ti/Al, and Ti/Pt/Au. The n-type electrode or the p-type electrode may be formed by physical vapor deposition, such as vacuum evaporation and sputtering.

A pad electrode for electrical connection with an external electrode or circuit may be disposed on the n-type electrode or the p-type electrode. The pad electrode preferably has a single-layer structure or a multilayer structure containing at least one metal selected from the group consisting of titanium (Ti), aluminum (Al), platinum (Pt), gold (Au), and nickel (Ni). Alternatively, the pad electrode may have a multilayer structure of Ti/Pt/Au or Ti/Au.

Assemblies of the GaN based semiconductor light-emitting devices including the preferred structures according to the embodiments may have face-up structures or flip-chip structures.

Examples of the GaN based semiconductor light-emitting device include light-emitting diodes (LEDs) and semiconductor lasers (LDs). As long as the stacked structure of the GaN based compound semiconductor layer is a light-emitting diode structure or a laser structure, the structure is not particularly limited. Examples of applications of the GaN based semiconductor light-emitting device include luminescent apparatuses each including the GaN based semiconductor light-emitting device and a color conversion material; direct-view image displays or projection image displays; surface-emitting light sources (backlight); liquid crystal display assemblies including color liquid crystal displays; lighting fixtures and lights used in transportation, such as automobiles, electric trains, shipping, and aircraft, e.g. headlights, taillights, high mount brake lights, side-marker lights, turn signal lamps, fog lights, interior lights, instrument-panel lights, light sources embedded in a variety of buttons, destination-indicating lights, emergency lights, and emergency exit sign lightings; lighting fixtures and lights used in architectural structures, e.g. outdoor lights, interior lights, light fixtures, emergency lights, and emergency exit sign lightings; street lights; various indicating lights used in signals, advertising signs, machines, and apparatuses; lighting fixtures and lighting portions used in tunnels and underground passages; special illumination used in various inspection apparatuses such as biological microscopes; sterilizers using light; deodorizers and sterilizers in combination with photocatalysts; exposure machines used in photography and semiconductor lithography; and apparatuses that transmit information by modulating light through spaces, optical fibers, waveguides.

Additional features and advantages are described herein, and will be apparent from, the following Detailed Description and the figures.

BRIEF DESCRIPTION OF THE FIGURES

FIG. 9 is a conceptual diagram showing a state in which a GaN based semiconductor light-emitting device is supplied with an operating current in order to evaluate a GaN based semiconductor light-emitting device;

FIG. 10A is a schematic view of a GaN based semiconductor light-emitting device when viewed from above;

FIG. 10B is a schematic cross-sectional view taken along arrow B-B in FIG. 10A (wherein the hatch lines are omitted);

DETAILED DESCRIPTION

The embodiments will be described below with reference to the drawings and by way of examples. First, characteristics of GaN based light-emitting diodes are discussed.

Figure 27:
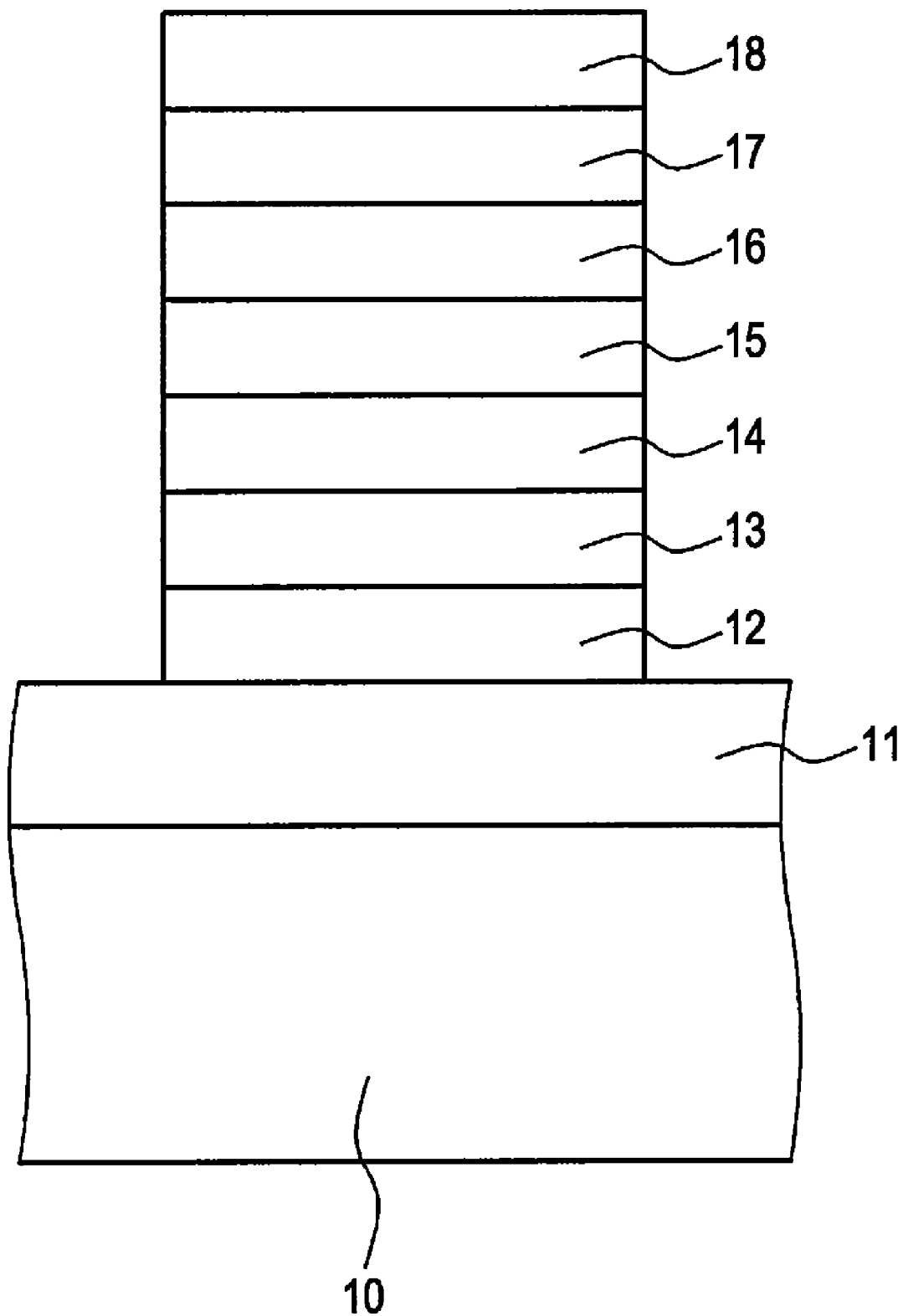
FIG. 27 is a conceptual diagram showing a layer structure of a GaN based semiconductor light-emitting device of reference device 1.

A GaN based semiconductor light-emitting device (hereinafter, referred to as "reference device 1") including stacked GaN based compound semiconductor layers was produced by MOCVD on a c-plane sapphire substrate. The reference device 1 is shown in FIG. 27 and will be described below. The emission wavelength λ of reference device 1 (light-emitting diode) is about 520 nm.

Reference Device 1

Reference device 1 includes:

(1) a c-plane sapphire substrate 10;

(2) a low-temperature-grown-GaN buffer layer 11 having a thickness of 30 nm;

(3) an undoped GaN layer 12 having a thickness of 1 μm;

(4) a first GaN based compound semiconductor layer 13 having a thickness of 3 μm, GaN being doped with Si and having a Si doping concentration of $5 \times 10^{11}/cm^3$;

(5) a lower spacer layer 14 having a thickness of 5 nm and composed of undoped GaN;

(6) an active layer 15 having a multiple-quantum-well structure in which well layers each having a thickness of 3 nm and composed of $In_{0.23}Ga_{0.77}N$ and barrier layers each having a thickness of 15 nm and composed of GaN are alternately stacked, the number of well layers being 7, and the number of barrier layers being 6;

(7) an upper spacer layer 16 having a thickness of 10 nm and composed of undoped GaN;

(8) a Mg-doped $Al_{0.15}Ga_{0.85}N$ layer 17 having a Mg doping concentration of $5 \times 10^{19}/cm^3$ and a thickness of 20 nm; and (9) a Mg-doped GaN layer (second GaN based compound semiconductor layer 18 having a thickness of 100 nm and having a Mg doping concentration of $5 \times 10^{19}/cm^3$.

Figure 28:
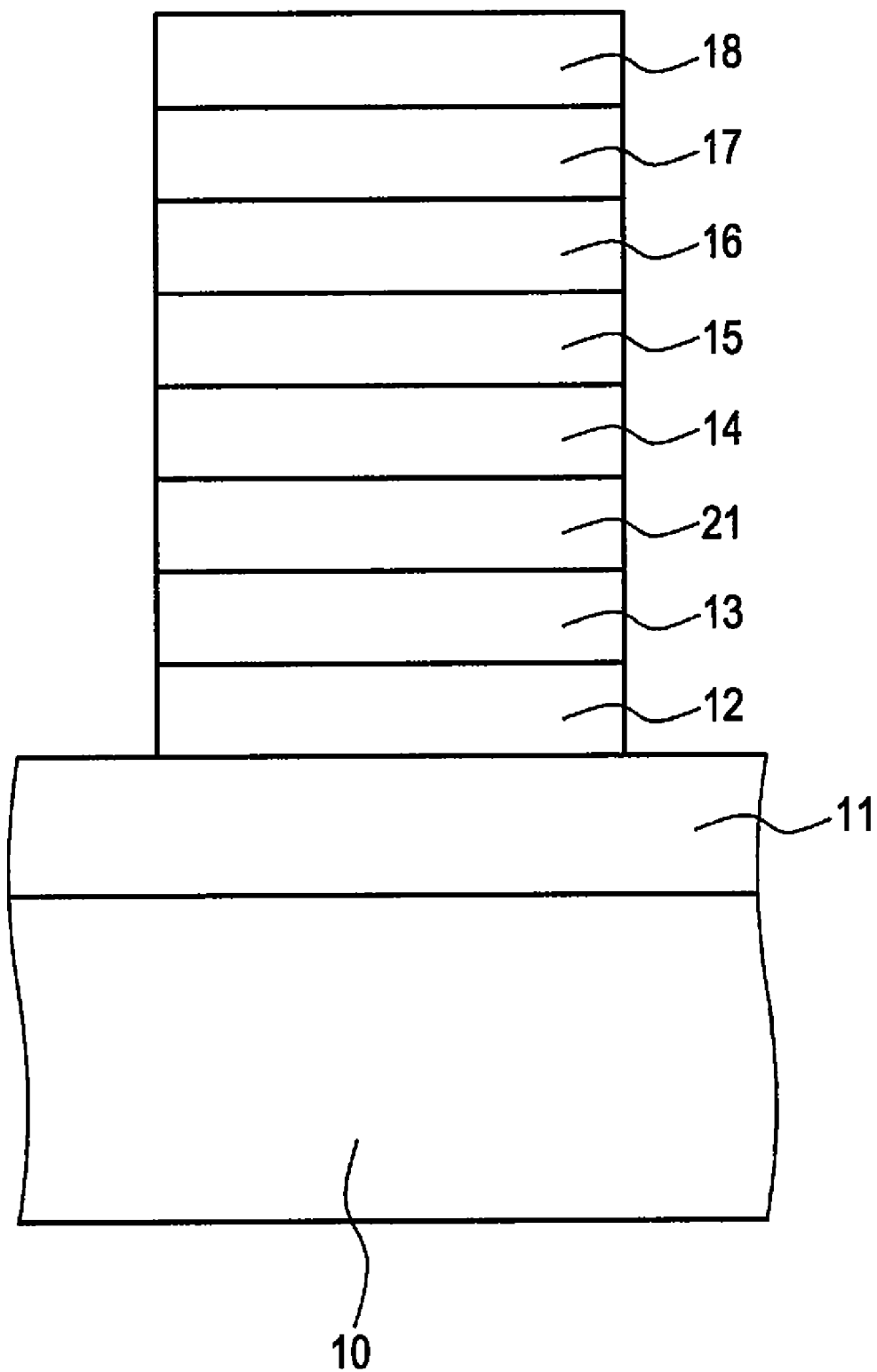
FIG. 28 is a conceptual diagram showing a layer structure of a GaN based semiconductor light-emitting device of reference device 2.

Furthermore, a GaN based semiconductor light-emitting device (hereinafter, referred to as "reference device 2") was produced. Reference device 2 had (4') an underlying layer 21 having a thickness of 150 nm, composed of Si-doped $In_{0.03}Ga_{0.97}N$ (Si dopant concentration: $5 \times 10^{18}/cm^3$), and disposed between the first GaN based compound semiconductor layer 13 and the lower spacer layer 14 of reference device 1 (see FIG. 28).

After crystal growth, reference devices 1 and 2 were subjected to annealing at 800° C. for 10 minutes in a nitrogen atmosphere to activate the p-type dopants.

In some drawings, the buffer layer 11, the undoped GaN layer 12, and the like are omitted.

Figure 11:
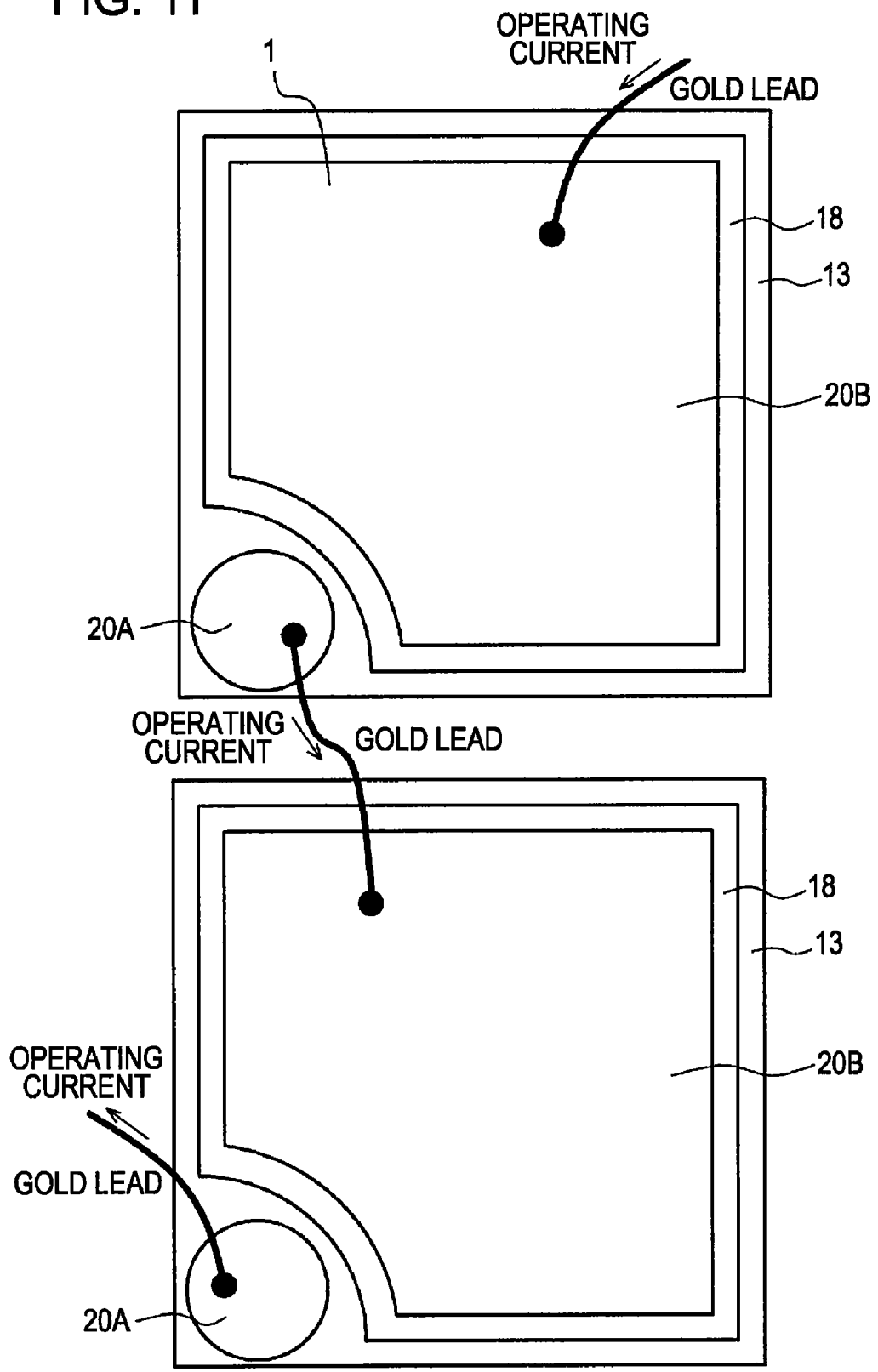
FIG. 11 is a schematic view of two GaN based semiconductor light-emitting devices connected in series when viewed from above.

In reference devices 1 and 2 and a GaN semiconductor light-emitting device according to EXAMPLE 1 described below, for the purpose of evaluation and simplification of production process, the following steps were performed by lithography and etching: partially exposing the first GaN based compound semiconductor layer 13 of an n-conductivity type, forming a p-type electrode 20B composed of Ag/Ni on the Mg-doped second GaN based compound semiconductor layer 18, and forming an n-type electrode 20A composed of Ti/Al on the first GaN based compound semiconductor layer 13. Probes were placed on the n-type electrode 20A and the p-type electrode 20B. An operating current was fed to detect light emitted from the back surface of the substrate 10. FIG. 9 is a conceptual diagram showing the state. FIG. 10A is a schematic view of a GaN based semiconductor light-emitting device 1 when viewed from above. FIG. 10B is a schematic cross-sectional view taken along arrow B-B in FIG. 10A (wherein the hatch lines are omitted). In reference devices 1 and 2 and a GaN based semiconductor light-emitting device according to EXAMPLE 1 described below, the area of the active layer (junction area) was set at $6 \times 10^{-4} cm^2$. The operating current density of the GaN based semiconductor light-emitting device is a value obtained by dividing the operating current by $6 \times 10^{-4} cm^2$, which is the area of the active layer. For example, when a 20 mA of operating current is fed into the GaN based semiconductor light-emitting device 1 shown in FIG. 10, the operating current density is calculated and found to be 33 A/cm². Furthermore, even when the GaN based semiconductor light-emitting devices 1 are connected in series as shown in FIG. 11, the operating current density is calculated and found to be 33 A/cm².

Figure 29A:
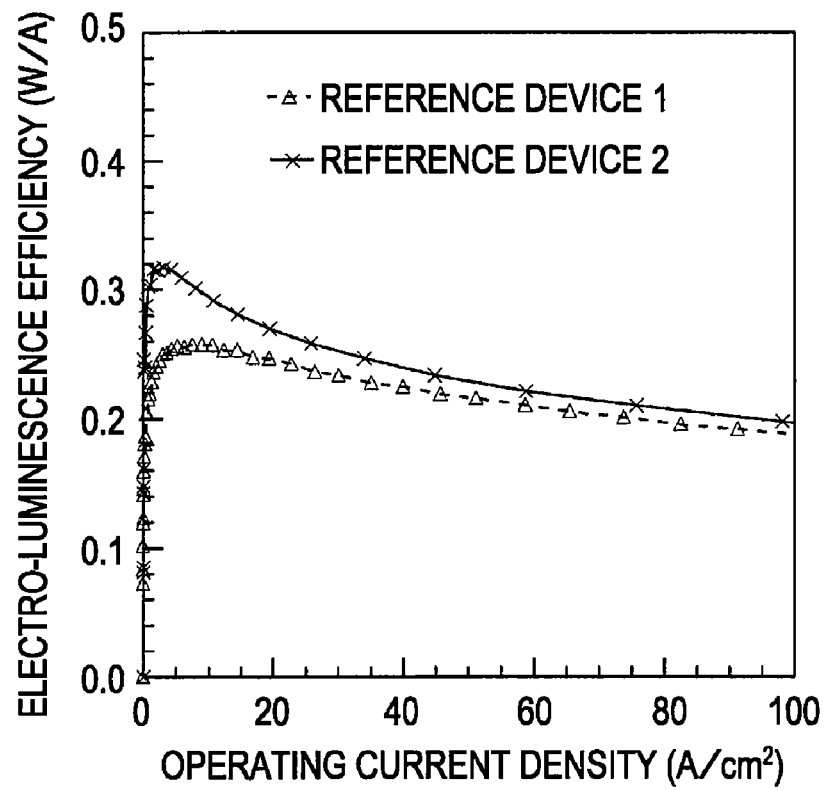
FIG. 29A is a graph showing the relationship between the operating current density and the EL efficiency of reference devices 1 and 2.
Figure 29B:
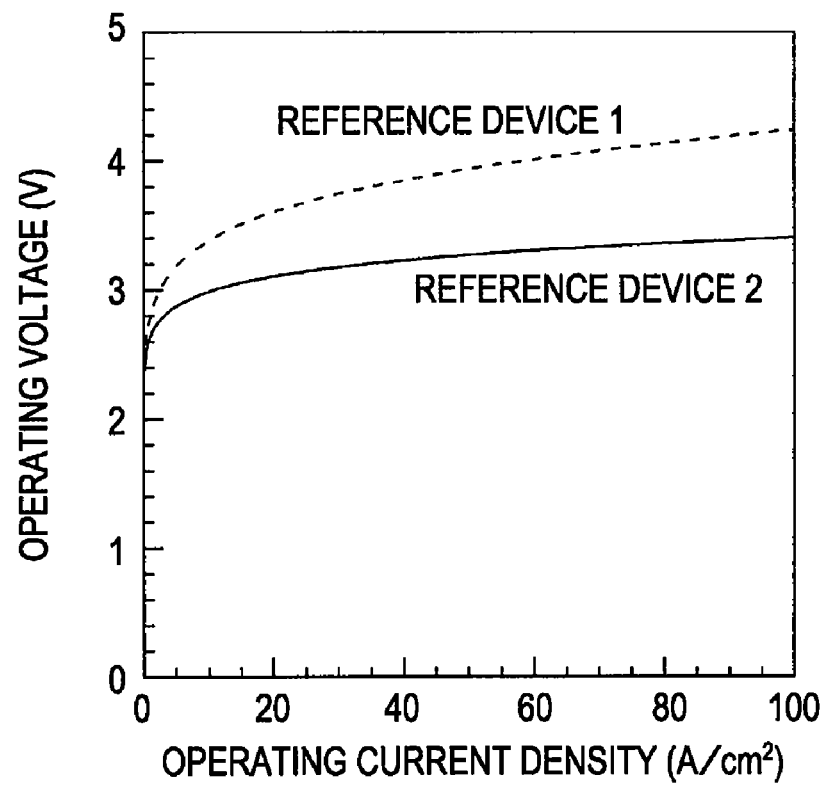
FIG. 29B is a graph showing the relationship between the operating current density and the operating voltage of reference devices 1 and 2.

FIG. 29A is a graph showing the relationship between the operating current density and the EL efficiency of reference devices 1 and 2. FIG. 29B is a graph showing the relationship between the operating current density and the operating voltage of reference devices 1 and 2. In a typical commercially available LED, about 20 mA of operating current is fed into a GaN based semiconductor light-emitting device having an active layer (junction area) with a size of 350 μm×350 μm, and about 350 mA of operating current is fed into a GaN based semiconductor light-emitting device having an active layer (junction area) that has a size of 1 mm×1 mm. Thus, the operating current density is about 20 A/cm² to 30 A/cm².

As shown in FIG. 29A, reference device 2 having the underlying layer 21 has higher EL efficiency within the range of about 20 A/cm² to 30 A/cm², which is an operating current density for a general LED. However, reference device 1 does not significantly differ on EL efficiency from reference device 2 at and near an operating current density of 100 A/cm².

On the other hand, as shown in FIG. 29B, reference device 2 has a significantly lower operating voltage than reference device 1.

As described above, the formation of the underlying layer 21 like reference device 2 increases the injection efficiency of electrons from the first GaN based compound semiconductor layer 13 of n-type conductivity, thereby providing high EL efficiency and low operating voltage at a relatively low operating current density. To further improve EL efficiency at a higher operating current density of 50 A/cm² to 100 A/cm² or more, a GaN based semiconductor light-emitting device according to EXAMPLE 1 will be described below.

EXAMPLE 1

Figure 1:
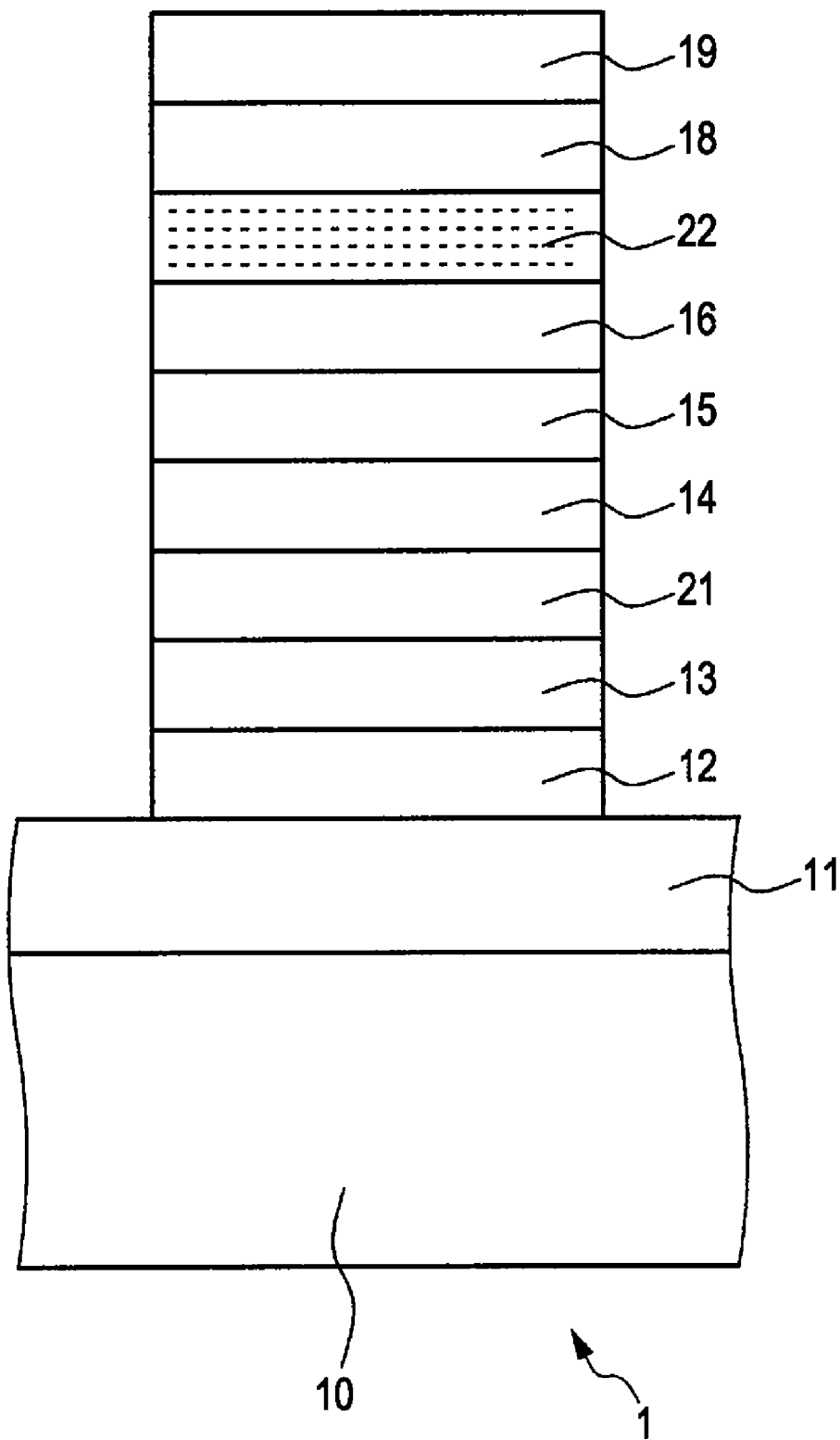
FIG. 1 is a conceptual diagram of the layer structure of a GaN based semiconductor light-emitting device according to EXAMPLE 1.
Figure 2:
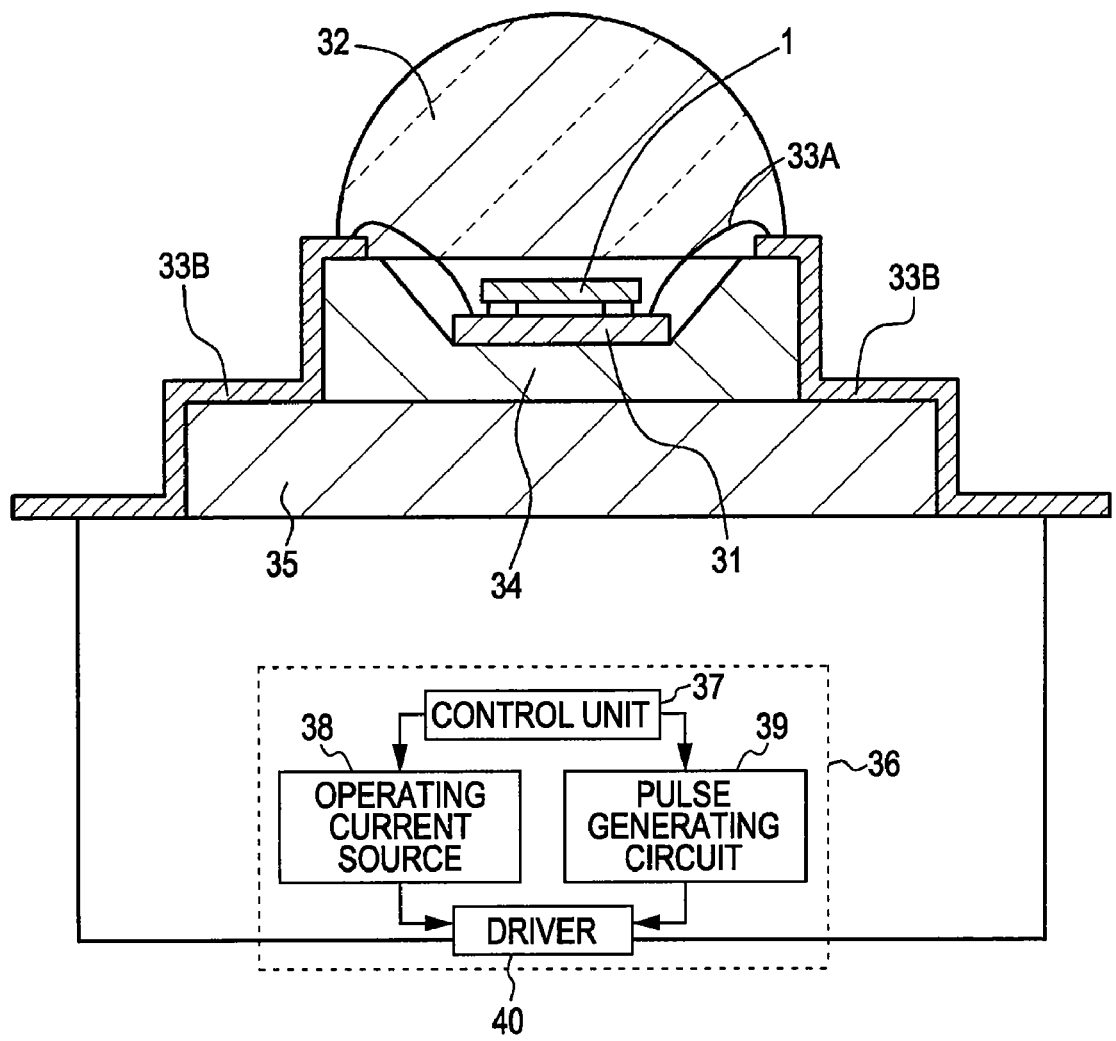
FIG. 2 is a cross-sectional view of the GaN based semiconductor light-emitting device according to an EXAMPLE 1.

EXAMPLE 1 relates to a GaN based semiconductor light-emitting device according to a first embodiment and a method for producing the same. Specifically, EXAMPLE 1 relates to a light-emitting diode (LED) and a method for producing the same. FIG. 1 is a conceptual diagram showing a layer structure. FIG. 2 is a schematic cross-sectional view. The GaN based semiconductor light-emitting device 1 in EXAMPLE 1 has the same layer structure as reference device 2, except that a superlattice layer 22 is disposed in place of the $Al_{0.15}Ga_{0.85}N$ layer 17 of reference device 2.

The GaN based semiconductor light-emitting device 1 in EXAMPLE 1 includes:

(A) a first GaN based compound semiconductor layer 13 of an n-type conductivity;

(B) an active layer 15;

(C) a second GaN based compound semiconductor layer 18 of a p-type conductivity;

(D) an underlying layer 21 composed of a GaN based compound semiconductor and disposed between the first GaN based compound semiconductor layer 13 and the active layer 15; and (E) a superlattice layer 22 composed of a GaN based compound semiconductor, disposed between the active layer 15 and the second GaN based compound semiconductor layer 18, and containing a p-type dopant.

The superlattice layer 22 has a structure in which 5 $Al_{0.15}Ga_{0.85}N$ layers each having a thickness of 2.4 nm and 5 GaN layers each having a thickness of 1.6 nm are stacked periodically and alternately. The superlattice layer 22 has a thickness of 20 nm, a superlattice period of 4 nm, and a total doping concentration of $5\times10^{19}/cm^3$, wherein the dopant is Mg.

As described above, the underlying layer 21 has a thickness of 150 nm, is composed of Si-doped $In_{0.03}Ga_{0.97}N$ (Si dopant concentration: $5\times10^{18}/cm^3$), and has a lower In content than the active layer (0.23). The underlying layer 21 is basically composed of a single composition. The underlying layer 21 is transmissive at an emission wavelength.

In the GaN semiconductor light-emitting device 1 according to EXAMPLE 1, an upper spacer layer 16 composed of an undoped GaN based compound semiconductor (specifically, an undoped GaN based layer having a thickness of 10 nm) is disposed between the active layer 15 and the superlattice layer 22. As described above, the lower spacer layer 14 composed of an undoped GaN based compound semiconductor (specifically, an undoped GaN layer having a thickness of 5 nm) is disposed between the active layer 15 and the underlying layer 21. The lower spacer layer 14 is disposed in order to further improve crystallinity of the active layer 15 disposed on the lower spacer layer 14. The upper spacer layer 16 is disposed in order to prevent the dopant, such as Mg, in the second GaN based compound semiconductor layer 18 from diffusing into the active layer 15.

Furthermore, a Mg-doped contact layer 19 composed of InGaN and having a thickness of 5 nm is optionally disposed on the second GaN based compound semiconductor layer 18. The contact layer 19 has an In content of 0.15 and a Mg doping concentration of $1\times10^{20}/cm^3$. Mg doping is not necessary, in some cases.

The GaN based semiconductor light-emitting device 1 is fixed on a submount 31. The GaN based semiconductor light-emitting device 1 is electrically connected to external electrodes 33B through leads (not shown) disposed on the submount 31 and gold leads 33A. The external electrodes 33B are electrically connected to a driving circuit 36. The submount 31 is attached to a reflector cup 34. The reflector cup 34 is attached to a heat sink 35. A plastic lens 32 is disposed above the GaN based semiconductor light-emitting device 1. A space between the plastic lens 32 and the GaN based semiconductor light-emitting device 1 is filled with a light-transmitting medium layer (not shown) that transmits light emitted from the GaN based semiconductor light-emitting device 1. Examples of the medium include epoxy resins (refractive index: for example, 1.5); gel materials, such as a trade name OCK-451 (refractive index: 1.51) and a trade name: OCK-433 (refractive index: 1.46) from Nye Lubricants, Inc.; silicone rubbers; and oil compounds such as silicone oil compounds, e.g. a trade name TSK5353 (refractive index: 1.45) from GE Toshiba Silicone Co., Ltd.

As shown in FIG. 2, the driving circuit 36 includes a control unit 37, an operating current source 38, a pulse-generating circuit 39 for generating a predetermined pulse signal, and a driver 40. In the driving circuit 36, the operating current source 38 feeds a peak current value under the control of the control unit 37. In order to regulate a pulse width fed into the GaN based semiconductor light-emitting device 1 and the number of pulses (pulse density) per operation cycle of the GaN based semiconductor light-emitting device 1 under the control of the control unit 37, the pulse-generating circuit 39 sends a pulse signal. In the driver 40 received the operating current and the pulse signal, an operating current fed from the operating current source 38 is pulse-modulated on the basis of the pulse signal fed from the pulse-generating circuit 39. The pulsed operating current is fed into the GaN based semiconductor light-emitting device 1. Thereby, the amount of luminescence of the GaN based semiconductor light-emitting device 1 is controlled.

In general, the control of the amount of luminescence (luminance) of the GaN based semiconductor light-emitting device may be performed on the basis of the pulse width control of the operating current. Alternatively, the control of the amount of luminescence may be performed on the basis of the pulse density control of the operating current, the pulse density control regulating the number of pulses (pulse density) per operation cycle of the GaN based semiconductor light-emitting device. Furthermore, these control methods may be used in combination. In examples described below, the amount of luminescence of the GaN based semiconductor light-emitting device may be controlled by the same method. In some cases, dc-current operation is performed, and the amount of luminescence (luminance) of the GaN based semiconductor light-emitting device may be controlled on the basis of the control of the dc current.

Figure 3:
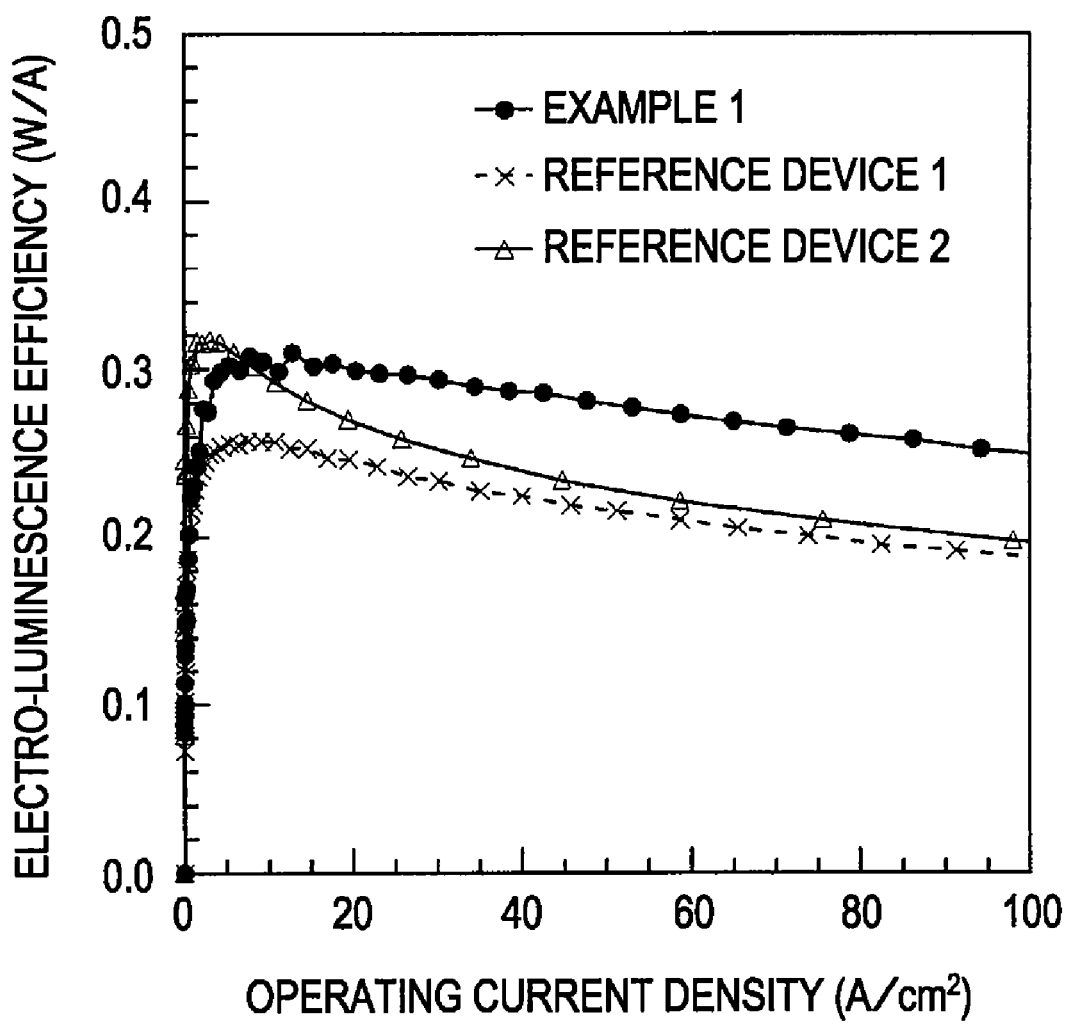
FIG. 3 is a graph showing the relationship between the operating current density and the electro-luminescence (EL) efficiency of each of the GaN based semiconductor light-emitting device according to an EXAMPLE 1, reference device 1, and reference device 2.

FIG. 3 is a graph showing the relationship between the operating current density and the EL efficiency of each of the GaN based semiconductor light-emitting device according to an EXAMPLE 1, reference device 1, and reference device 2. As is clear from FIG. 3, the GaN based semiconductor light-emitting device according to EXAMPLE 1 exhibits a higher EL efficiency than reference devices 1 and 2 in the range of 20 $A/cm^2$ to 30 $A/cm^2$, which is an operating current density for a usual LED, and even at 50 $A/cm^2$ or more. Furthermore, even when the operating current density is as high as 300 $A/cm^2$, the GaN based semiconductor light-emitting device according to an EXAMPLE 1 exhibits a luminous efficiency about 20% higher than reference devices 1 and 2 (not shown in FIG. 3). High EL efficiency even at operating current densities exceeding 100 $A/cm^2$ significantly serves to expand applications due to the improvement of luminance and to reduce a cost per the mount of luminescence.

Figure 4:
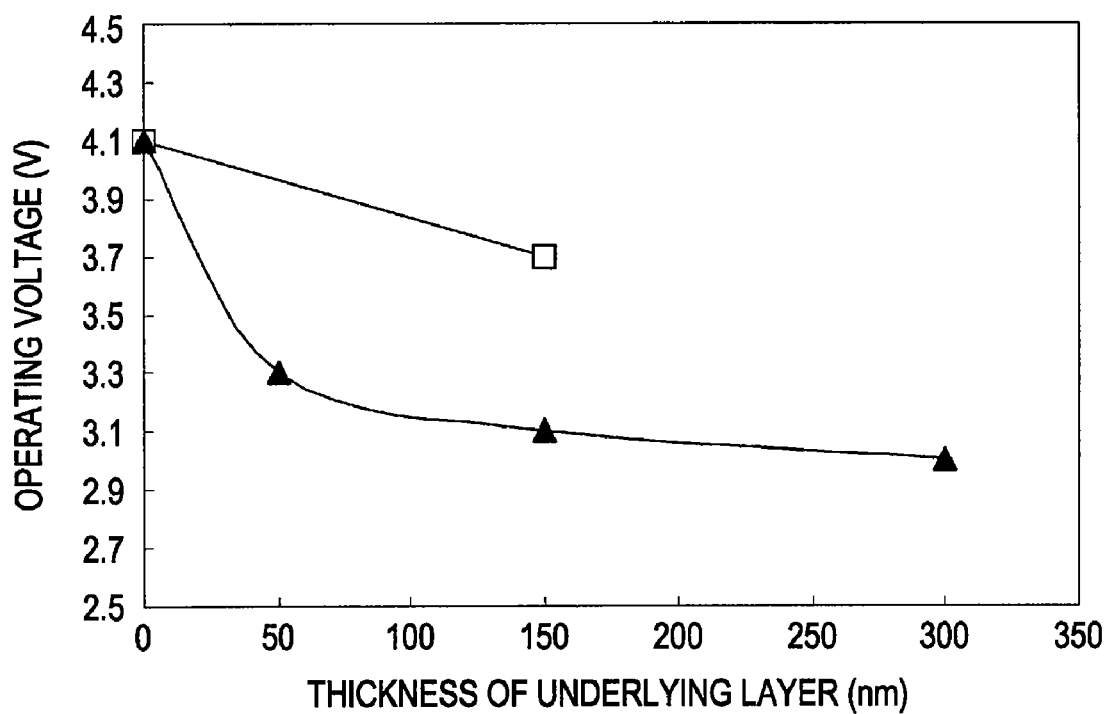
FIG. 4 is a graph showing the relationship between the thickness of an underlying layer and the operating voltage of the GaN based semiconductor light-emitting device according to an EXAMPLE 1.

FIG. 4 is a graph showing the relationship between the thickness of the underlying layer 21 and the operating voltage of the GaN based semiconductor light-emitting device having the layer structure shown in FIG. 1. The operating current density was set at 50 $A/cm^2$. Furthermore, FIG. 4 also shows the relationship between the thickness of an undoped underlying layer composed of InGaN and the operating voltage, wherein the operating voltage of the undoped underlying layer 21 is represented by an open quadrangle. As shown in FIG. 4, the Si-doped underlying layer 21 reduces the operating voltage of the GaN based semiconductor light-emitting device (light-emitting diode). In FIG. 4, the Si doping concentration is $5\times10^{18}/cm^3$. Furthermore, the results of various tests demonstrated that the Si doping concentration was preferably $1\times10^{16}/cm^3$ to $1\times10^{21}/cm^3$ and more preferably $2\times10^{17}/cm^3$ to $2\times10^{19}/cm^3$ in order to reduce the operating voltage. It was found that the underlying layer 21 having a thickness of about 20 nm had the effect of reducing the operating voltage, but the underlying layer 21 preferably has a thickness of 50 nm or more. Furthermore, since the underlying layer 21 is adjacent to the active layer 15, the underlying layer 21 may be required to have a composition so as not to absorb the emission wavelength. That is, the underlying layer 21 may be required to have a lower In content than the active layer 15.

Figure 5:
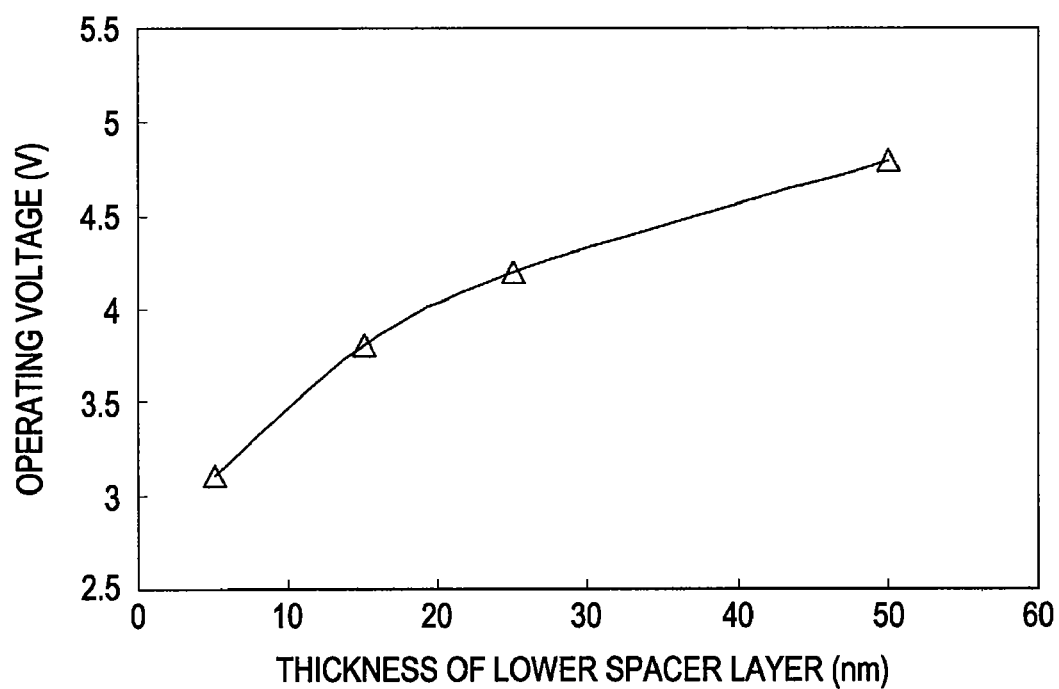
FIG. 5 is a graph showing the relationship between the thickness of a lower spacer layer and the operating voltage of the GaN based semiconductor light-emitting device according to an EXAMPLE 1.

FIG. 5 is a graph showing the relationship between the thickness of the lower spacer layer 14 and the operating voltage of the GaN based semiconductor light-emitting device having the layer structure shown in FIG. 1. The operating current density was set at 50 $A/cm^2$. As is apparent from FIG. 5, the thickness of the lower spacer layer 14, in other words, the distance between the underlying layer 21 and the active layer 15 is 50 nm or less and preferably 20 nm or less in order to obtain a low operating voltage.

It was found that when the superlattice layer 22 had a thickness below 5 nm, the amount of holes fed from the superlattice layer 22 into the active layer 15 was insufficient, and the barrier to electrons was also insufficient to increase the overflow of electrons into the second GaN based compound semiconductor layer 18 of a p-type conductivity. For example, a GaN based semiconductor light-emitting device having the superlattice layer 22 in which one $Al_{0.15}Ga_{0.85}N$ sublayer having a thickness of 2.4 nm and one GaN sublayer having a thickness of 1.6 nm are stacked was produced as a trial model. The EL efficiency thereof was measured, and the resulting EL efficiency was 20% lower than the GaN based semiconductor light-emitting device according to EXAMPLE 1. The results of various tests demonstrated that the superlattice layer 22 preferably had a thickness of 5 nm or more and more preferably 10 nm or more.

The superlattice layer 22 including the Mg-doped AlGaN sublayer and the Mg-doped GaN sublayer has a hole concentration higher than a Mg-doped bulk AlGaN layer in any superlattice period. Thus, it is believed that the superlattice having at least two atomic layers, i.e., a single AlGaN atomic layer and a single GaN atomic layer, expresses the effect. Furthermore, when a current is allowed to flow through the superlattice layer 22 in the thickness direction, it is important that the superlattice has a period of 20 nm or less. In view of the controllability of gas switching during crystal growth and a reduction in the series resistance of the superlattice layer 22, the superlattice period is preferably 2 nm to 10 nm. The superlattice according to an embodiment is not limited to a superlattice having completely the same period. Even when the period and the composition are changed during the growth, the same effect is obtained as long as physical phenomena, i.e., a piezoelectric field and band bending, occur. Furthermore, doping of Mg, which is a p-type dopant, is not limited to uniform doping but may be based on modulation doping.

Figure 6:
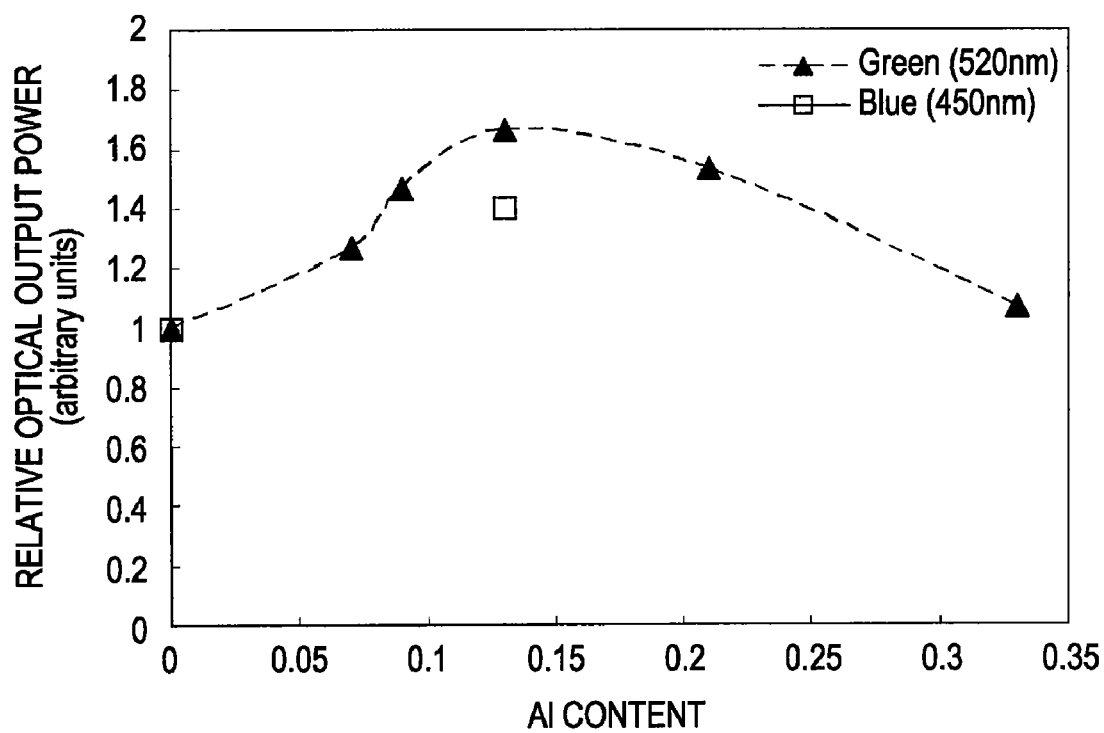
FIG. 6 is a graph showing the relationship between the Al content in an AlGaN sublayer constituting a superlattice layer and the relative optical output power of the GaN based semiconductor light-emitting device according to an EXAMPLE 1.

FIG. 6 is a graph showing the relationship between the Al content in the AlGaN sublayer constituting the superlattice layer 22 and the optical output power of the GaN based semiconductor light-emitting device having the layer structure shown in FIG. 1. The operating current density was set at 50 A/cm$^2$. As is apparent from FIG. 6, the optical output power increases at an Al content of about 0.05. The results of further experiments demonstrated that when the AlGaN sublayer in the superlattice layer 22 had an Al content of 0.05 to 0.4, preferably 0.05 to 0.30, and more preferably 0.10 to 0.25, optical output powers of a blue LED and a green LED were effectively improved.

An outline of a method for producing the GaN based semiconductor light-emitting device 1 according to EXAMPLE 1 will be described below.

Step 100

The c-plane sapphire substrate 10 is used. The substrate 10 is subjected to cleaning at a substrate temperature of 1,050° C. for 10 minutes in a hydrogen carrier gas and then cooled to 500° C. On the basis of MOCVD, a trimethylgallium (TMG) gas, which is a gallium source, is fed while feeding an ammonia gas, which is a nitrogen source, to form the low-temperature-grown-GaN buffer layer 11 having a thickness of 30 nm on the substrate 10. Then, the supply of the TMG gas is stopped.

Step 110

The substrate temperature is increased to 1,020° C., and then the supply of the TMG gas is started to form the undoped GaN layer 12 having a thickness of 1 μm on the buffer layer 11. Subsequently, the supply of a monosilane (SiH$_4$) gas, which is a silicon source, is started to form the first GaN based compound semiconductor layer 13 composed of Si-doped GaN (GaN:Si) of an n-type conductivity and having a thickness of 3 μm on the undoped GaN layer 12. The doping concentration is about $5 \times 10^{18}$/cm$^3$.

Step 120

The supply of the TMG gas and the SiH$_4$ gas is stopped. After the substrate temperature is reduced to 800° C., the carrier gas is switched from the hydrogen gas to a nitrogen gas. A trimethylgallium (TEG) gas, which is a Ga source, a trimethylindium (TMI) gas, which is a In source, and the SiH$_4$ gas, which is Si source, are used to form the Si-doped underlying layer 21 composed of $In_{0.03}Ga_{0.97}N$ (Si doping concentration: $5 \times 10^{18}$/cm$^3$) and having a thickness of 150 nm.

Step 130

The supply of the TEG gas, the TMI gas, and the SiH$_4$ gas is stopped. The substrate temperature is reduced to 750° C. The TEG gas and the TMI gas are fed while switching a valve to form an undoped GaN layer (lower spacer layer 14) having a thickness of 5 nm and then the active layer 15 having a multiple-quantum-well structure including InGaN well layers and GaN barrier layers. Part of the undoped GaN layer (lower spacer layer 14) may be grown subsequent to the underlying layer 21. The substrate temperature may be changed during the crystal growth. The In content in each well layer is for example, 0.23, which corresponds to a emission wavelength λ of 515 nm. The In content in each well layer may be determined on the basis of a target emission wavelength.

Step 140

After the completion of the multiple-quantum-well structure, the substrate temperature is increased to 800° C. while an undoped GaN layer having a thickness of 10 nm (upper spacer layer 16). The supply of a trimethylaluminum (TMA) gas, which is an Al source, a bis(cyclopentadienyl)magnesium (Cp$_2$Mg) gas, which is a Mg source, is started to form the superlattice layer 22 including Mg-doped AlGaN (AlGaN:Mg) sublayers each having a thickness of 2.4 nm and an Al content of 0.15 and Mg-doped GaN sublayers having a thickness of 1.6 nm, the superlattice layer 22 having a superlattice period of 5. The Mg doping concentration is about $5 \times 10^{19}$/cm$^3$.

Step 150

The supply of the TEG gas, the TMA gas, and the Cp$_2$Mg gas is stopped, and the carrier gas is switched from nitrogen to hydrogen. The substrate temperature is increased to 850° C. The supply of the TMG gas and the Cp$_2$Mg gas is started to form the second GaN compound semiconductor layer 18 composed of Mg-doped GaN (GaN:Mg) and having a thickness of 100 nm on the superlattice layer 22. The doping concentration is about $5 \times 10^{19}$/cm$^3$. Then, the contact layer 19 composed of InGaN is formed. The supply of the TMG gas and the Cp$_2$Mg gas is stopped. The substrate temperature is reduced. The supply of the ammonia gas is stopped at a substrate temperature of 600° C. The substrate temperature is reduced to room temperature to complete crystal growth.

A substrate temperature $T_{MAX}$ (° C.) after the growth of the active layer 15 satisfies $T_{MAX}$<1350–0.75λ and preferably $T_{MAX}$<1250–0.75λ, wherein λ represents an emission wavelength. At the substrate temperature $T_{MAX}$ after the growth of the active layer 15, it is possible to suppress thermal degradation of the active layer 15 also as described in Japanese Unexamined Patent Application Publication No. 2002-319702.

Step 160

After the completion of crystal growth, the substrate is subjected to annealing in a nitrogen gas atmosphere to activate p-type impurity (p-type dopant). A known annealing is performed at 800° C. for 10 minutes. On the other hand, in EXAMPLE 1, annealing is performed at a temperature in the range of 450° C. to 700° C. in a substantially hydrogen-free atmosphere. Specifically, annealing is performed at 550° C. for 25 minutes in a nitrogen atmosphere containing 1 percent by volume of an oxygen gas to activate the p-type impurity (p-type dopant).

Acceleration of activation at low temperatures due to oxygen has also been documented in Hulletal., APL. Vol. 76 (2000) p. 2271. However, in this published document, at an annealing temperature of 700° C. or lower, even when 10 percent by volume of an oxygen gas is incorporated into a nitrogen gas, the second GaN compound semiconductor layer of a p-type conductivity is steeply increased (see FIG. 1 in this document).

Figure 7A:
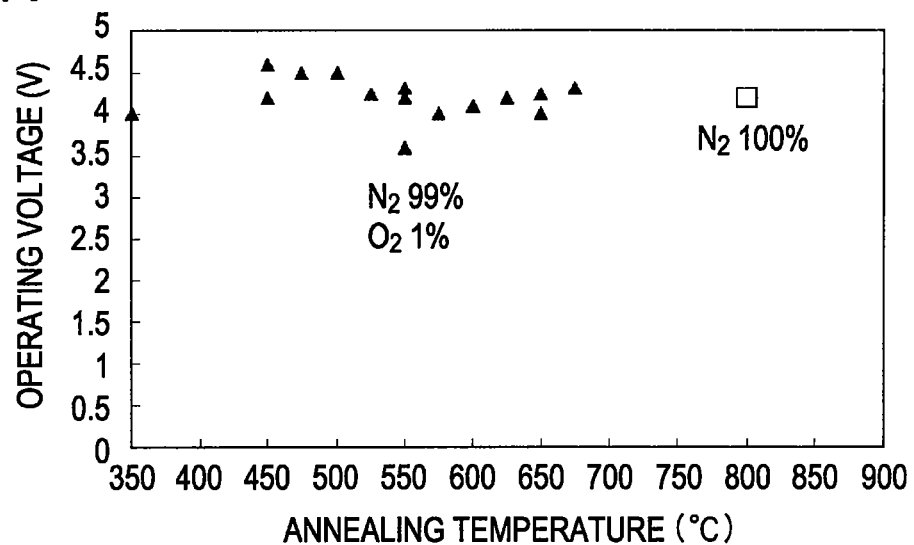
FIG. 7A is a graph showing the relationship between the annealing temperature and the operating voltage, annealing being performed to activate a p-type dopant.
Figure 7B:
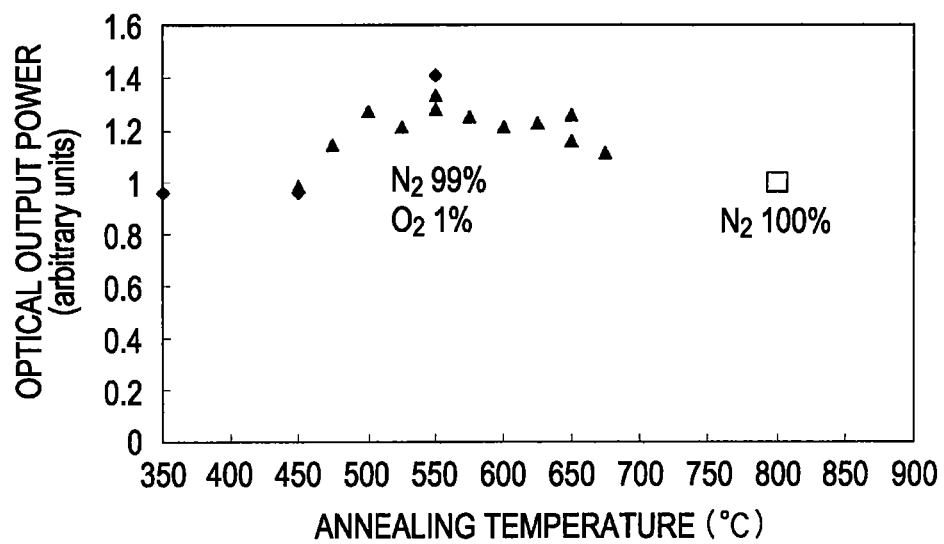
FIG. 7B is a graph showing the relationship between the annealing temperature and the optical output power, annealing being performed to activate a p-type dopant.

FIG. 7A is a graph showing the relationship between the annealing temperature and the operating voltage. FIG. 7B is a graph showing the relationship between the annealing temperature and the optical output power. The operating current density was set at 50 A/cm². In EXAMPLE 1, even when the annealing temperature is set at 650° C. or 550° C., the operating voltage is comparable to that after annealing at 800° C. in 100% of a nitrogen gas atmosphere. This is because the formation of the superlattice layer 22 results in high carrier concentration, thereby reducing the annealing temperature. When the annealing temperature is set at 650° C. or 550° C., the optical output power is higher than that in the case in which annealing is performed at 800° C. in 100% of a nitrogen gas atmosphere. This is due to the suppression of thermal damage of the well layers each composed of InGaN and prevention of the diffusion of the impurity (p-type dopant) into the active layer.

Step 170

Then, similarly to a wafer process and a step of forming a chip which are employed for a usual LED, the resulting epitaxial wafer is subjected to a photolithographic step, an etching step, and steps of forming a p-type electrode and an n-type electrode, followed by dicing to form chips. Furthermore, the resulting chips are subjected to resin molding and packaging to produce various types of light-emitting diodes, such as shell-shape LEDs and surface-mount LEDs.

The active layer 15 has the structure in which the $In_{0.23}Ga_{0.77}N$ well sublayers each having a thickness of 3 nm and the GaN barrier sublayers each having a thickness of 15 nm are alternately stacked and has an emission wavelength λ of 515 nm (green). However, the active layer 15 is not limited thereto. For example, when a structure in which $In_{0.15}Ga_{0.85}N$ well sublayers each having a thickness of 3 nm and GaN barrier layers each having a thickness of 15 nm are alternately stacked is used, it is possible to obtain a GaN based semiconductor light-emitting device (light-emitting diode) that emits light having an emission wavelength λ of 450 nm (blue). This is true for EXAMPLE 2 described below.

EXAMPLE 2

Figure 8:
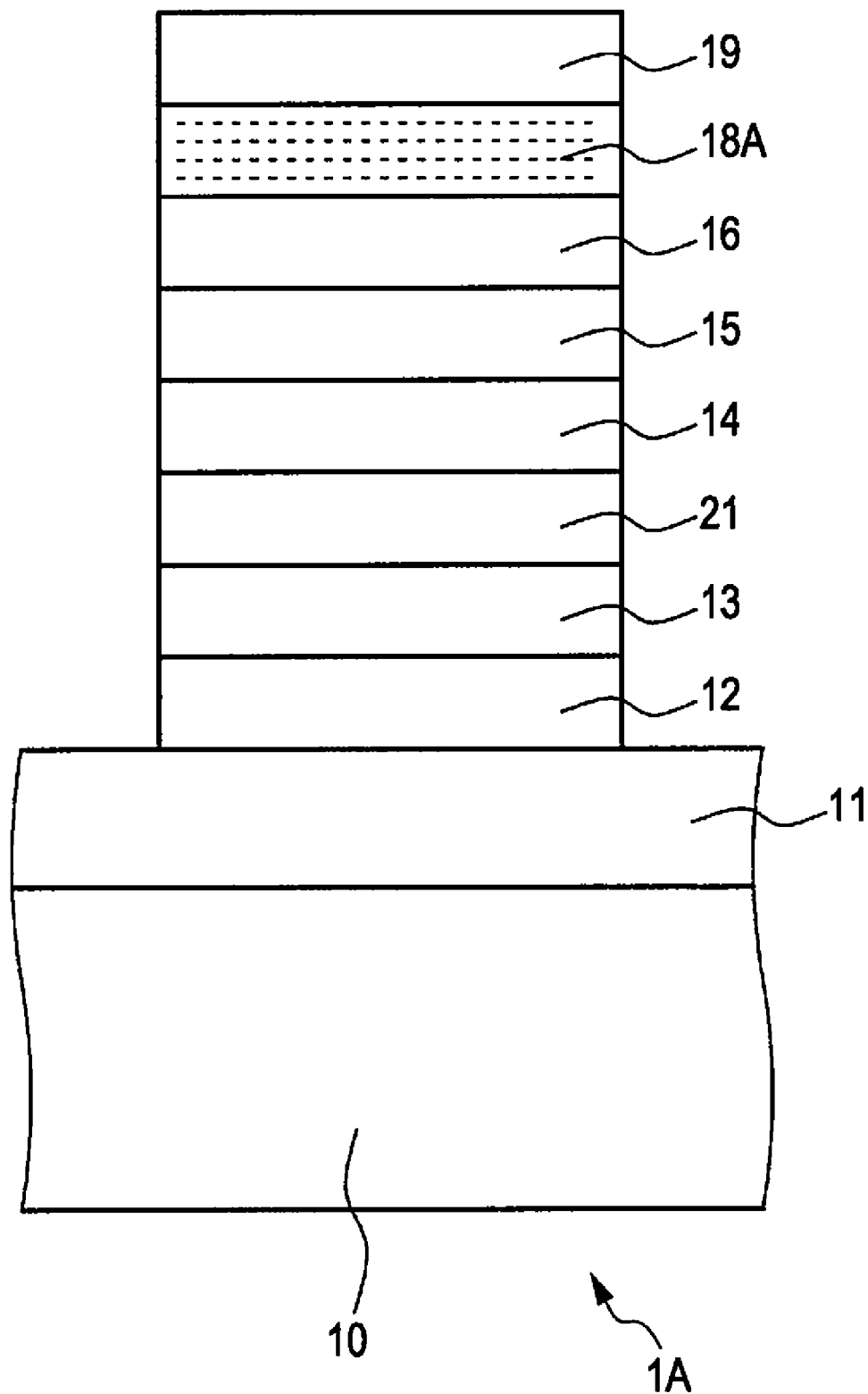
FIG. 8 is a conceptual diagram of the layer structure of a GaN based semiconductor light-emitting device according to EXAMPLE 2.

EXAMPLE 2 relates to a GaN based semiconductor light-emitting device according to the second embodiment of the present invention and a method for producing the device. Specifically, EXAMPLE 2 relates to a light-emitting diode (LED) and a method for producing the same. FIG. 8 is a conceptual diagram showing a layer structure. The GaN based semiconductor light-emitting device 1A in EXAMPLE 2 has the same layer structure as EXAMPLE 1, except that the superlattice layer 22 in EXAMPLE 1 is not disposed, but the second GaN based compound semiconductor layer 18A has a superlattice.

The GaN based semiconductor light-emitting device 1A according to EXAMPLE 2 includes:

(A) a first GaN based compound semiconductor layer 13 of an n-type conductivity;

(B) an active layer 15;

(C) a second GaN based compound semiconductor layer 18A of a p-type conductivity; and (D) an underlying layer 21 composed of a GaN based compound semiconductor and disposed between the first GaN based compound semiconductor layer 13 and the active layer 15;

wherein the second GaN based compound semiconductor layer 18A has a superlattice.

The superlattice of the second GaN based compound semiconductor layer 18A has a structure in which 30 $Al_{0.15}Ga_{0.85}N$ layers each having a thickness of 2.4 nm and 30 GaN layers each having a thickness of 1.6 nm are stacked periodically and alternately. The second GaN based compound semiconductor layer 18A has a thickness of 120 nm, a superlattice period of 4 nm, and a doping concentration of $5\times10^{19}/cm^3$ all over, wherein the dopant is Mg.

Other layers, i.e., the low-temperature-grown-GaN buffer layer 11, the undoped GaN layer 12, the first GaN based compound semiconductor layer 13, the underlying layer 21, the lower spacer layer 14, the active layer 15, the upper spacer layer 16, and the contact layer 19 are identical to the layers of the GaN based semiconductor light-emitting device 1 according to EXAMPLE 1. Thus, the description in detail is omitted.

It was found that the GaN based semiconductor light-emitting device 1A according to EXAMPLE 2 exhibits a higher EL efficiency than reference devices 1 and 2 in the range of 20 A/cm² to 30 A/cm², which is an operating current density for a usual LED, and even at 50 A/cm² or more.

Also in EXAMPLE 2, the relationship between the thickness of the underlying layer 21 and the operating voltage was studied. The results demonstrate that the Si-doped underlying layer 21 reduces the operating voltage of the GaN based semiconductor light-emitting device (light-emitting diode) as in EXAMPLE 1. The Si doping concentration was preferably $1\times10^{16}/cm^3$ to $1\times10^{21}/cm^3$ and more preferably $2\times10^{17}/cm^3$ to $2\times10^{19}/cm^3$ in order to reduce the operating voltage. It was found that the underlying layer 21 having a thickness of about 20 nm had the effect of reducing the operating voltage, but the underlying layer 21 preferably has a thickness of 50 nm or more. Furthermore, since the underlying layer 21 is adjacent to the active layer 15, the underlying layer 21 may be required to have a composition so as not to absorb the emission wavelength. That is, the underlying layer 21 may be required to have a lower In content than the active layer 15. Furthermore, the relationship between the thickness of the lower spacer layer 14 and the operating voltage was studied. Similarly to EXAMPLE 1, it was found that the thickness of the lower spacer layer 14, in other words, the distance between the underlying layer 21 and the active layer 15 is 50 nm or less and preferably 20 nm or less in order to obtain a low operating voltage.

It was found that when the second GaN based compound semiconductor layer 18A had a thickness below 5 nm, the amount of holes fed from the second GaN based compound semiconductor layer 18A into the active layer 15 was insufficient, and the barrier to electrons was also insufficient. The results of various tests demonstrated that the second GaN based compound semiconductor layer 18A preferably had a thickness of 5 nm or more, more preferably 20 nm or more, and further preferably 50 nm or more.

The second GaN based compound semiconductor layer 18A having the superlattice including the Mg-doped AlGaN sublayer and the Mg-doped GaN sublayer has a hole concentration higher than a Mg-doped bulk AlGaN layer in any superlattice period. Thus, it is believed that the superlattice having at least two atomic layers, i.e., a single AlGaN atomic layer and a single GaN atomic layer, expresses the effect. Furthermore, when a current is allowed to flow through the second GaN based compound semiconductor layer 18A having the superlattice in the thickness direction, it is important that the superlattice has a period of 20 nm or less. In view of the controllability of gas switching during crystal growth and a reduction in the series resistance of the second GaN based compound semiconductor layer 18A having the superlattice, the superlattice period is preferably 2 nm to 10 nm. The superlattice according to an embodiment is not limited to a superlattice having completely the same period. Even when the period and the composition are changed during the growth, the same effect is obtained as long as physical phenomena, i.e., a piezoelectric field and band bending, occur. Furthermore, doping of Mg, which is a p-type dopant, is not limited to uniform doping but may be based on modulation doping.

The optical output power was measured with changing the Al content in the AlGaN layer constituting the second GaN based compound semiconductor layer 18A. Similarly to EXAMPLE 1, the optical output power increases at an Al content of about 0.05. The results of further experiments demonstrated that when the AlGaN layer constituting the second GaN based compound semiconductor layer 18A having the superlattice had an Al content of 0.05 to 0.4, preferably 0.05 to 0.30, and more preferably 0.10 to 0.25, optical output powers of a blue LED and a green LED were effectively improved.

The GaN based semiconductor light-emitting device 1A according to EXAMPLE 2 can be produced in substantially the same method as that for producing the GaN based semiconductor light-emitting device 1 according to EXAMPLE 1. That is, steps similar to step 100 to step 130 in EXAMPLE 1 are performed. Furthermore, in a step similar to step 140 in EXAMPLE 1, the substrate temperature is increased to 800° C. while the upper spacer layer 16 is grown. The supply of a trimethylaluminum (TMA) gas, which is an Al source, a bis(cyclopentadienyl)magnesium ($Cp_2Mg$) gas, which is a Mg source, is started to form the second GaN based compound semiconductor layer 18A having the superlattice including Mg-doped AlGaN (AlGaN:Mg) sublayers each having a thickness of 2.4 nm and an Al content of 0.15 and Mg-doped GaN sublayers having a thickness of 1.6 nm, the second GaN based compound semiconductor layer 18A having a superlattice period of 30. The doping concentration is about $5\times10^{19}/cm^3$. In a step similar to step 150 in EXAMPLE 1, the contact layer 19 composed of InGaN is grown on the second GaN based compound semiconductor layer 18A. Furthermore, steps similar to step 160 to step 170 in EXAMPLE 1 are performed to produce a light-emitting diode.

EXAMPLE 3

Examples of a light-emitting apparatus, an image display, a surface-emitting light-source unit, and a liquid crystal display assembly to which the GaN based semiconductor light-emitting device 1 according to in EXAMPLE 1 or the GaN based semiconductor light-emitting device 1A according to EXAMPLE 2 is applied will be described below. In the following description, for the sake of convenience, the GaN based semiconductor light-emitting devices 1 and 1A are referred to as "GaN based semiconductor light-emitting device 1".

EXAMPLE 3 relates to a light-emitting apparatus. The light-emitting apparatus according to EXAMPLE 3 includes a GaN based semiconductor light-emitting device and a color conversion material on which light emitted from the GaN based semiconductor light-emitting device is incident and that emits light having a wavelength different from that of the light emitted from the GaN based semiconductor light-emitting device. The light-emitting apparatus according to EXAMPLE 3 has the same structure as the known light-emitting apparatus. For example, the color conversion material is applied on the light-emitting portion of the GaN based semiconductor light-emitting device. The GaN based semiconductor light-emitting device (light-emitting diode) has the same basic structure as in EXAMPLES 1 and 2.

Examples of the outgoing light emitted from the GaN based semiconductor light-emitting device in the light-emitting apparatus according to EXAMPLE 3 include visible light, ultraviolet rays, and combination of visible light and ultraviolet rays.

In the light-emitting apparatus according to EXAMPLE 3, the outgoing light from the GaN based semiconductor light-emitting device is blue. The outgoing light from the color conversion material may be at least one light ray selected from the group consisting of yellow, green and red. Alternatively, the outgoing light from the GaN based semiconductor light-emitting device is mixed with the outgoing light from the color conversion material (for example, yellow; red and green; yellow and red; green, yellow, and red) to emit white light. The light-emitting apparatus is not limited thereto. The light-emitting apparatus may be a variable color illumination and may be applied to a display.

Examples of a color conversion material that emits red light by excitation due to blue outgoing light from the GaN based semiconductor light-emitting device include red-light-emitting phosphor particles composed of, for example, (ME:Eu)S (wherein ME represents at least one atom selected from the group consisting of Ca, Sr, and Ba; this is true for the description below), $(M:Sm)_x(Si,Al)_{12}(O,N)_{16}$ (wherein M represents at least one atom selected from the group consisting of Li, Mg, and Ca; this is true for the description below), and $ME_2Si_5N_8$:Eu, (Ca:Eu)$SiN_2$, and (Ca:Eu)$AlSiN_3$. Examples of a color conversion material that emits green light by excitation due to blue outgoing light from the GaN based semiconductor light-emitting device include green-light-emitting phosphor particles, such as (ME:Eu)$Ga_2S_4$, $(M:RE)_x(Si,Al)_{12}(O,N)_{16}$ (wherein RE represents Tb or Yb), $(M:Tb)_x(Si,Al)_{12}(O,N)_{16}$, $(M:Yb)_x(Si,Al)_{12}(O,N)_{16}$, and $Si_{6-Z}Al_ZO_ZN_{8-Z}$:Eu. Furthermore, examples of a color conversion material that emits yellow light by excitation due to blue outgoing light from the GaN based semiconductor light-emitting device include yellow-light-emitting phosphor particles, such as YAG (yttrium-aluminum-garnet) phosphor particles. These color conversion materials may be used alone. Alternatively, a mixture of two or more materials may be used. Furthermore, a structure in which outgoing light other than yellow light, green light, and red light is emitted from the color conversion material mixture obtained by mixing two or more color conversion materials may be used. Specifically, for example, a structure from which cyan light is emitted may be used. In this case, a mixture of green-light-emitting phosphor particles composed of, for example, $LaPO_4$:Ce,Tb, $BaMgAl_{10}O_{17}$:Eu,Mn, $Zn_2SiO_4$:Mn, $MgAl_{11}O_{19}$:Ce,Tb, $Y_2SiO_5$:Ce,Tb, or $MgAl_{11}O_{19}$:CE,Tb,Mn, and blue-light-emitting phosphor particles composed of, for example, $BaMgAl_{10}O_{17}$:Eu, $BaMg_2Al_{16}O_{27}$:Eu, $Sr_2P_2O_7$:Eu, $Sr_5(PO_4)_3Cl$:Eu, $(Sr,Ca,Ba,Mg)_5(PO_4)_3Cl$:Eu, $CaWO_4$, or $CaWO_4$:Pb, may be used.

Examples of a color conversion material that emits red light by excitation due to ultraviolet rays, which is outgoing light, from the GaN based semiconductor light-emitting device include red-light-emitting phosphor particles composed of, for example, $Y_2O_3$:Eu, $YVO_4$:Eu, $Y(P,V)O_4$:Eu, $3.5MgO.0.5MgF_2.Ge_2$:Mn, $CaSiO_3$:Pb,Mn, $Mg_6AsO_{11}$:Mn, $(Sr,Mg)_3(PO_4)_3$:Sn, $La_2O_2S$:Eu, and $Y_2O_2S$:Eu. Examples of a color conversion material that emits green light by excitation due to ultraviolet rays, which is outgoing light, from the GaN based semiconductor light-emitting device include green-light-emitting phosphor particles composed of, for example, $LaPO_4$:Ce,Tb, $BaMgAl_{10}O_{17}$:Eu,Mn, $Zn_2SiO_4$:Mn, $MgAl_{11}O_{19}$:Ce,Tb, $Y_2SiO_5$:Ce,Tb, $MgAl_{11}O_{19}$:CE,Tb,Mn, and $Si_{6-z}Al_zO_zN_{8-z}$:Eu. Examples of a color conversion material that emits blue light by excitation due to ultraviolet rays, which is outgoing light, from the GaN based semiconductor light-emitting device include blue-light-emitting phosphor particles composed of, for example, $BaMgAl_{10}O_{17}$:Eu, $BaMg_2Al_{16}O_{27}$:Eu, $Sr_2P_2O_7$:Eu, $Sr_5(PO_4)_3Cl$:Eu, $(Sr,Ca,Ba,Mg)_5(PO_4)_3Cl$:Eu, $CaWO_4$, and $CaWO_4$:Pb. Examples of a color conversion material that emits yellow light by excitation due to ultraviolet rays, which is outgoing light, from the GaN based semiconductor light-emitting device include yellow-light-emitting phosphor particles such as YAG phosphor particles. These color conversion materials may be used alone. Alternatively, a mixture of two or more materials may be used. Furthermore, a structure in which outgoing light other than yellow light, green light, and red light is emitted from the color conversion material mixture obtained by mixing two or more color conversion materials may be used. Specifically, a structure from which cyan light is emitted may be used. In this case, a mixture of the green-light-emitting phosphor particles and the blue-light-emitting phosphor particles may be used.

The color conversion material is not limited to the phosphor particles. The color conversion material may be light-emitting particles, such as nanometer-scale CdSe/ZnS particles or nanometer-scale silicon particles, which emit light rays of multiple colors with high efficiency using the quantum effect. It is known that rare-earth atoms incorporated in semiconductor materials emit sharp light due to transitions in the inner shells. Light-emitting particles to which such a technique is applied may also be used.

EXAMPLE 4

EXAMPLE 4 relates to an image display. The image display according to EXAMPLE 4 is one including a GaN based semiconductor light-emitting device for displaying an image. The basic structure of the GaN based semiconductor light-emitting device (light-emitting diode) is the same as that described in EXAMPLE 1 or 2.

Examples of the image display according to EXAMPLE 4 include image displays having structures described below. Unless otherwise specified, the number of GaN based semiconductor light-emitting devices constituting the image display or a light-emitting device panel may be determined on the basis of specifications of the image display. The image display may further have a light valve on the basis of the specifications.

(1) Image Display According to Embodiment 1A

A passive-matrix direct-view image display including:

(α) a light-emitting device panel 60 having GaN based semiconductor light-emitting devices 1 arrayed in a matrix in a plane, wherein emitting and nonemitting states of each GaN based semiconductor light-emitting device 1 are controlled such that an observer directly visually identifies the emitting state of each GaN based semiconductor light-emitting device 1 to recognize an image.

Figure 12A:
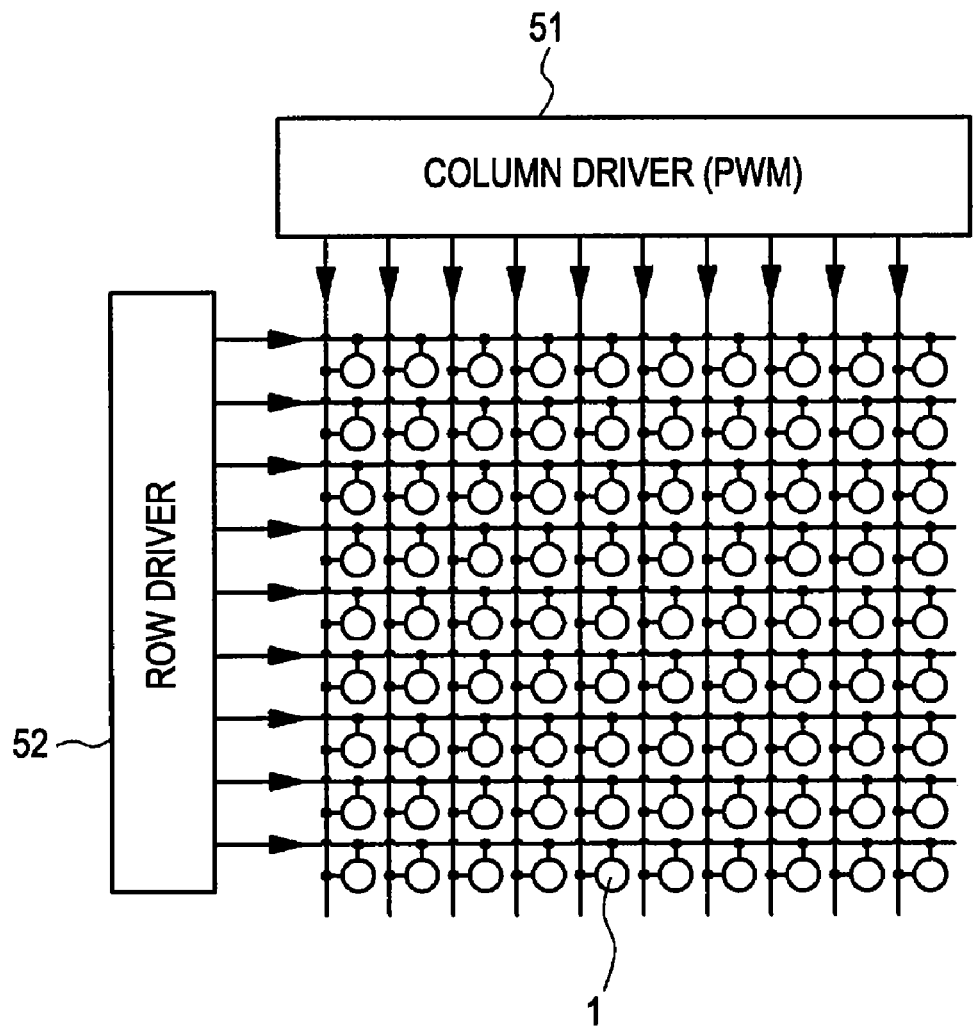
FIG. 12A is a circuit diagram of a passive-matrix, direct-view image display (image display according to embodiment 1A) according to EXAMPLE 4.
Figure 12B:
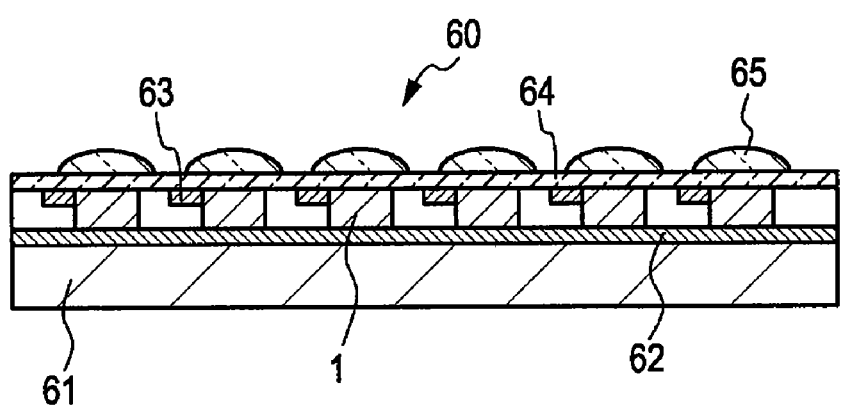
FIG. 12B is a schematic cross-sectional view of a light-emitting device panel in which GaN based semiconductor light-emitting devices are arrayed in a matrix.

FIG. 12A is a circuit diagram of the light-emitting device panel 60 constituting a passive-matrix, direct-view image display. FIG. 12B is a schematic cross-sectional view of a light-emitting device panel having GaN based semiconductor light-emitting devices 1 arrayed in a matrix in a plane. One electrode (p-type electrode or n-type electrode) of each GaN based semiconductor light-emitting device 1 is connected to a column driver 51. The other electrode (n-type electrode or p-type electrode) of each GaN based semiconductor light-emitting device 1 is connected to a row driver 52. The emitting/nonemitting state of each GaN based semiconductor light-emitting device 1 is controlled by, for example, row driver 52. The column driver 51 feeds an operating current for operating each GaN based semiconductor light-emitting device 1. One of the functions of the column driver 51 is the same function as that of the driving circuit 36 in EXAMPLE 1. Selection and operation of each GaN based semiconductor light-emitting device 1 can be performed by a known method. Thus, a detailed description is omitted.

For example, the light-emitting device panel 60 includes a support 61 formed of a printed circuit board; the GaN based semiconductor light-emitting devices 1 mounted on the support 61; lines 62 extending in the x-direction, the lines 62 being disposed on the support 61, each being electrically connected to one electrode (p-type electrode or n-type electrode) of each GaN based semiconductor light-emitting device 1, and each being connected to the column driver 51 or the row driver 52; lines 63 extending in the y-direction, the lines 63 each being electrically connected to the other electrode (n-type electrode or p-type electrode) of each GaN based semiconductor light-emitting device 1 and each being connected to the row driver 52 or the column driver 51; a transparent base 64 covering the GaN based semiconductor light-emitting devices 1; and microlenses 65 disposed on the transparent base 64. However, the light-emitting device panel 60 is not limited such a structure.

(2) Image Display According to Embodiment 1A

An active-matrix direct-view image display including:

(α) a light-emitting device panel having GaN based semiconductor light-emitting devices 1 arrayed in a matrix in a plane, wherein emitting and nonemitting states of each GaN based semiconductor light-emitting device 1 are controlled such that an observer directly visually identifies the emitting state of each GaN based semiconductor light-emitting device 1 to recognize an image.

Figure 13:
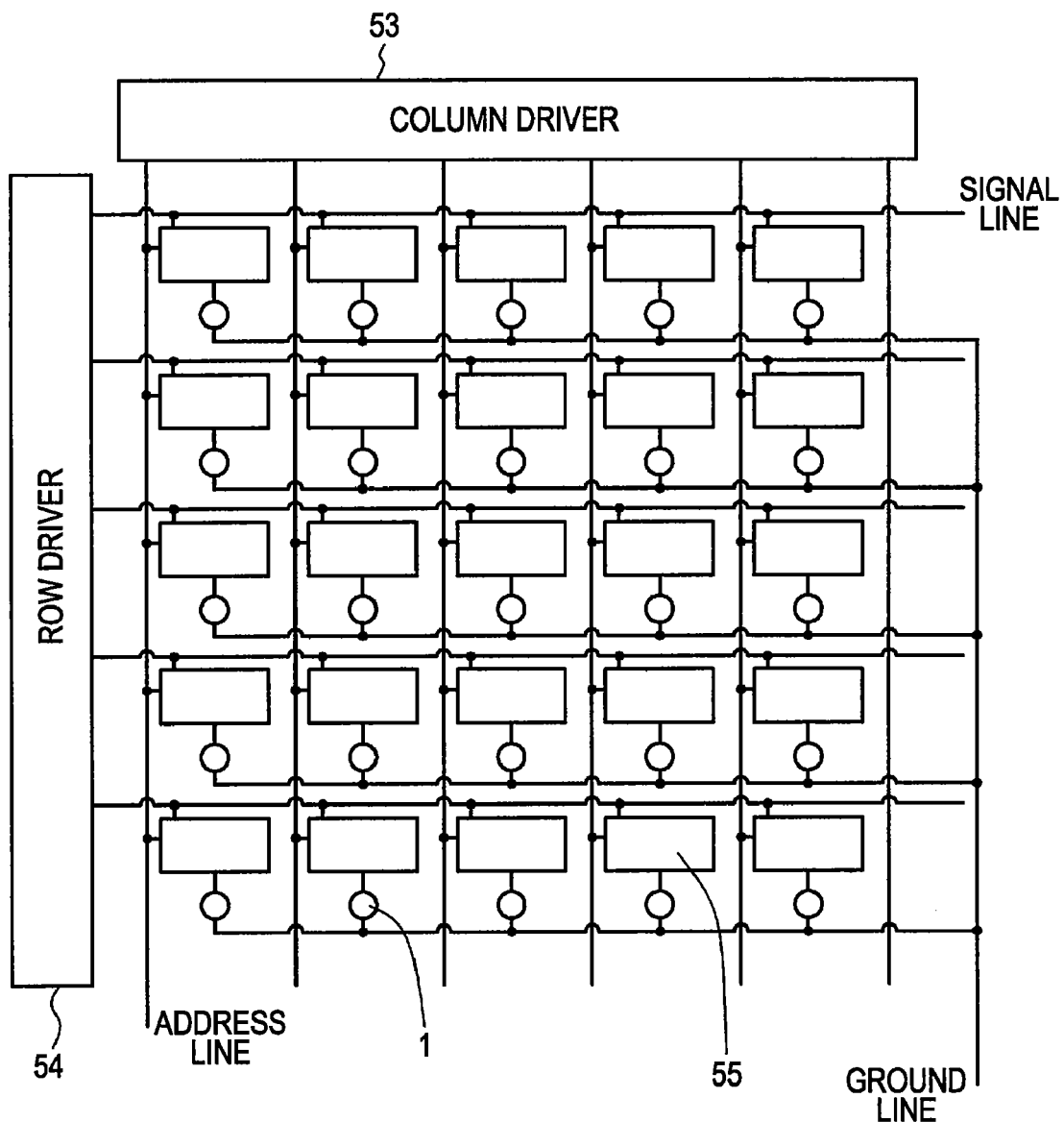
FIG. 13 is a circuit diagram of an active-matrix direct-view image display (image display according to embodiment 1A) according to EXAMPLE 4.

FIG. 13 is a circuit diagram of the light-emitting device panel constituting a passive-matrix, direct-view image display. One electrode (p-type electrode or n-type electrode) of each GaN based semiconductor light-emitting device 1 is connected to individual drivers 55. The drivers 55 are each connected to a column driver 53 and a row driver 54. The other electrode (n-type electrode or p-type electrode) of each GaN based semiconductor light-emitting device 1 is connected to a ground line. The emitting/nonemitting state of each GaN based semiconductor light-emitting device 1 is controlled by, for example, selecting the drivers 55 by the row driver 54. The column driver 53 sends a luminance signal for operating each GaN based semiconductor light-emitting device 1 to the corresponding driver 55. A predetermined voltage from a power supply (not shown) is applied to the drivers 55. The drivers 55 feed operating currents corresponding to the luminance signals (on the basis of PDM control or PWM control) to the GaN based semiconductor light-emitting devices 1. One of the functions of the column driver 53 is the same function as that of the driving circuit 36 in EXAMPLE 1. Selection and operation of each GaN based semiconductor light-emitting device 1 can be performed by the known method. Thus, the detailed description is omitted.

(3) Image Display According to Embodiment 1B

A projection passive-matrix or active-matrix image display including:

(α) the light-emitting device panel 60 having GaN based semiconductor light-emitting devices 1 arrayed in a matrix in a plane, wherein emitting and nonemitting states of each GaN based semiconductor light-emitting device 1 are controlled, and controlled light is projected on a screen to display an image.

Figure 14:
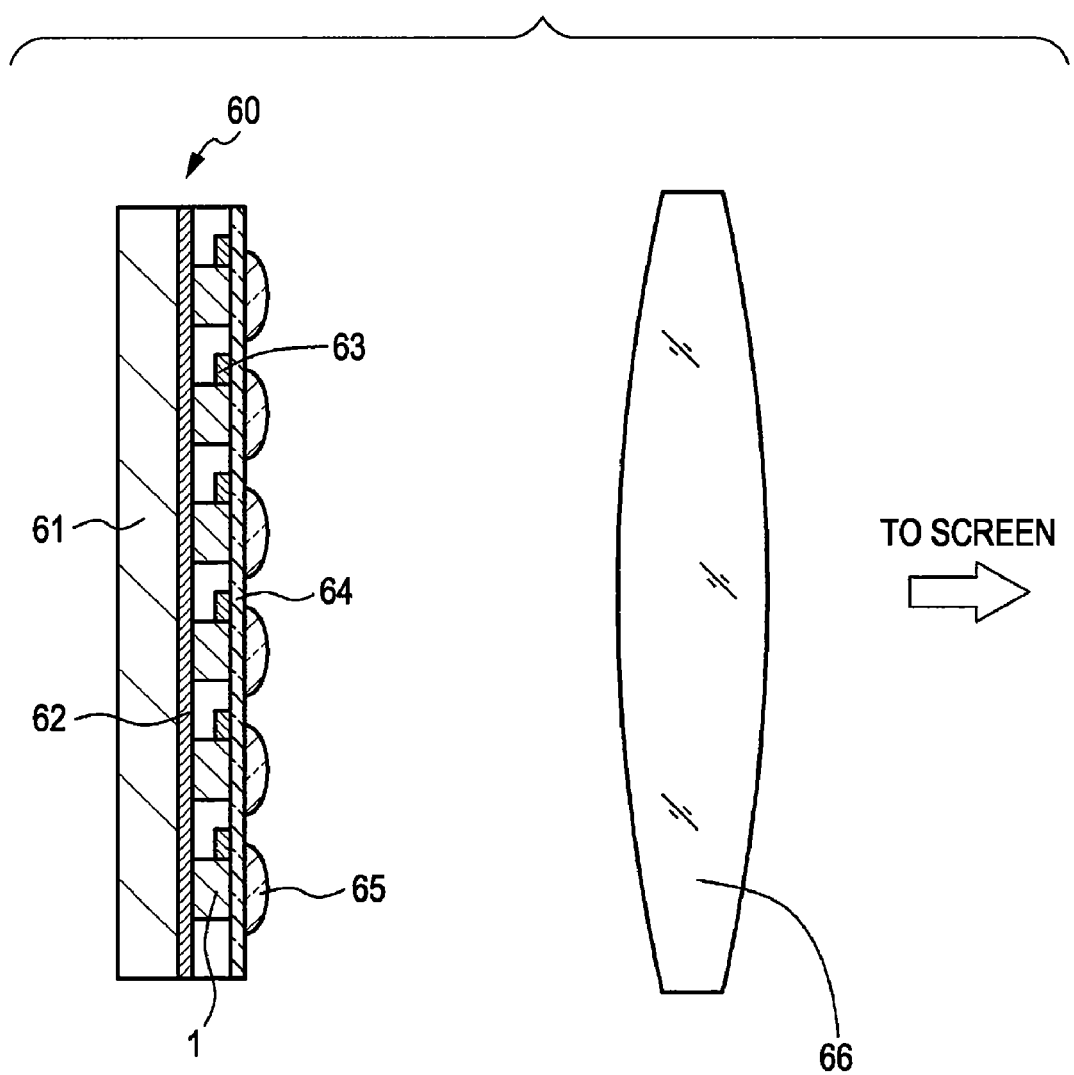
FIG. 14 is a conceptual diagram of a projection image display (image display according to embodiment 1B) including a light-emitting device panel in which GaN based semiconductor light-emitting devices are arrayed in a matrix.

A circuit diagram of a light-emitting device panel constituting such a passive-matrix image display is the same as that shown in FIG. 12A. A circuit diagram of a light-emitting device panel constituting such an active-matrix image display is the same as that shown in FIG. 13. Thus, the detailed description is omitted. FIG. 14 is a conceptual diagram of the light-emitting device panel 60 having GaN based semiconductor light-emitting devices 1 arrayed in a matrix in a plane. Light emitted from the light-emitting device panel 60 is projected on a screen through a projector lens 66. The light-emitting device panel 60 has the same structure as that of the light-emitting device panel 60 described with reference to FIG. 12B. Thus, the detailed description is omitted.

(4) Image Display According to Embodiment 1C

A direct-view or projection color image display including:

(α) a red-light-emitting device panel 60R having red-light-emitting semiconductor devices 1R (AlGaInP based semiconductor light-emitting devices, GaN based light-emitting semiconductor devices, or the like) arrayed in a matrix in a plane;

(β) a green-light-emitting device panel 60G having GaN based semiconductor green-light-emitting devices 1G arrayed in a matrix in a plane;

(γ) a blue-light-emitting device panel 60B having GaN based semiconductor blue-light-emitting devices 1B arrayed in a matrix in a plane; and (δ) a unit (for example, the dichroic prism 67) that combines light rays emitted from the red-light-emitting-device panel 60R, the green-light-emitting device panel 60G, and the blue-light-emitting device panel 60B into a single optical path, wherein emitting and nonemitting states of each of the red-light-emitting semiconductor devices 1R, GaN based semiconductor green-light-emitting devices 1G, and GaN based semiconductor blue-light-emitting devices 1B are controlled.

Figure 15:
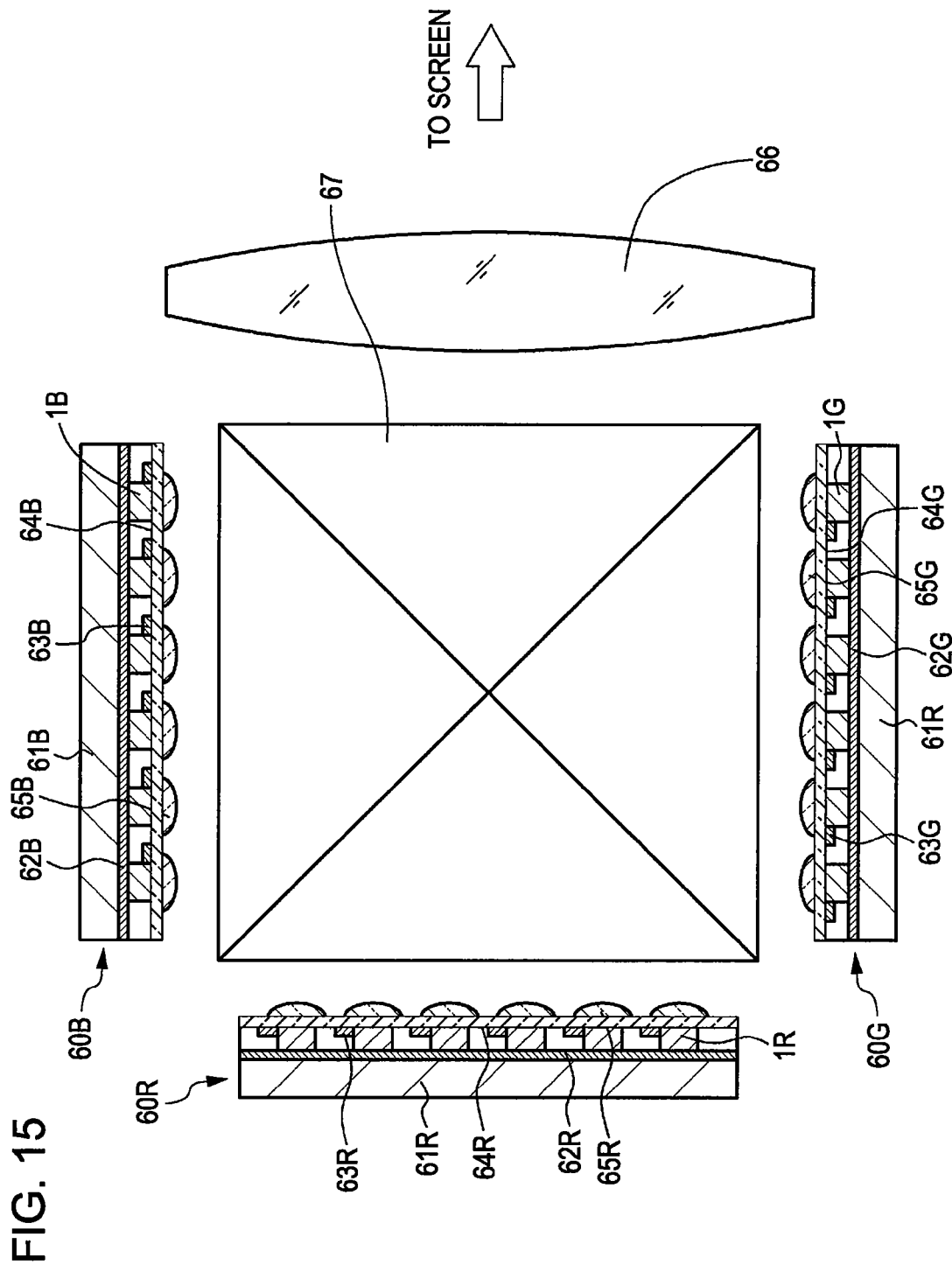
FIG. 15 is a conceptual diagram of a projection color image display (image display according to embodiment 1C) including a red-emitting device panel, a green-emitting device panel, and a blue-emitting device panel.

A circuit diagram of a light-emitting device panel constituting such a passive-matrix image display is the same as that shown in FIG. 12A. A circuit diagram of a light-emitting device panel constituting such an active-matrix image display is the same as that shown in FIG. 13. Thus, the detailed description is omitted. FIG. 15 is a conceptual diagram of the light-emitting device panels 60R, 60G, and 60B having the GaN based semiconductor light-emitting devices 1R, 1G, and 1B arrayed in a matrix in a plane. Light rays emitted from the light-emitting device panels 60R, 60G, and 60B are incident on the dichroic prism 67. The optical paths of these light rays are combined into a single optical path. The combined light rays are directly viewed in a direct-view image display or are projected on a screen through the projector lens 66 in a projection image display. The structures of the light-emitting device panels 60R, 60G, and 60B are identical to that of the light-emitting device panel 60 described with reference to FIG. 12B. Thus, the detailed description is omitted.

In such an image display, the GaN based semiconductor light-emitting devices 1 described in EXAMPLE 1 or 2 are preferably used as the GaN based semiconductor light-emitting devices 1R, 1G, and 1B constituting the light-emitting device panels 60R, 60G, and 60B. In some cases, for example, AlInGaP based compound semiconductor light-emitting diodes may be used as the red-light-emitting semiconductor devices 1R constituting the red-light-emitting-device panel 60R, and the GaN based semiconductor light-emitting devices 1 described in EXAMPLE 1 or 2 may be used as the light-emitting semiconductor devices 1G and 1B constituting the light-emitting device panels 60G and 60B.

(5) Image Display According to Embodiment 1D

A direct-view or projection image display including:

(α) a GaN based semiconductor light-emitting device 101; and (β) a light-passage control device, which is a kind of a light valve, for controlling the passage of outgoing light emitted from the GaN based semiconductor light-emitting device 101, wherein the passage of outgoing light emitted from the GaN based semiconductor light-emitting device 101 is controlled by a liquid crystal display 68, which is a light-passage control device, to display an image.

Examples of the light-passage control device serving as a light valve include the liquid crystal display 68 including high-temperature polysilicon thin-film transistors, Digital Micromirror Device (DMD), and Liquid Crystal On Silicon (LCOS).

Figure 16:
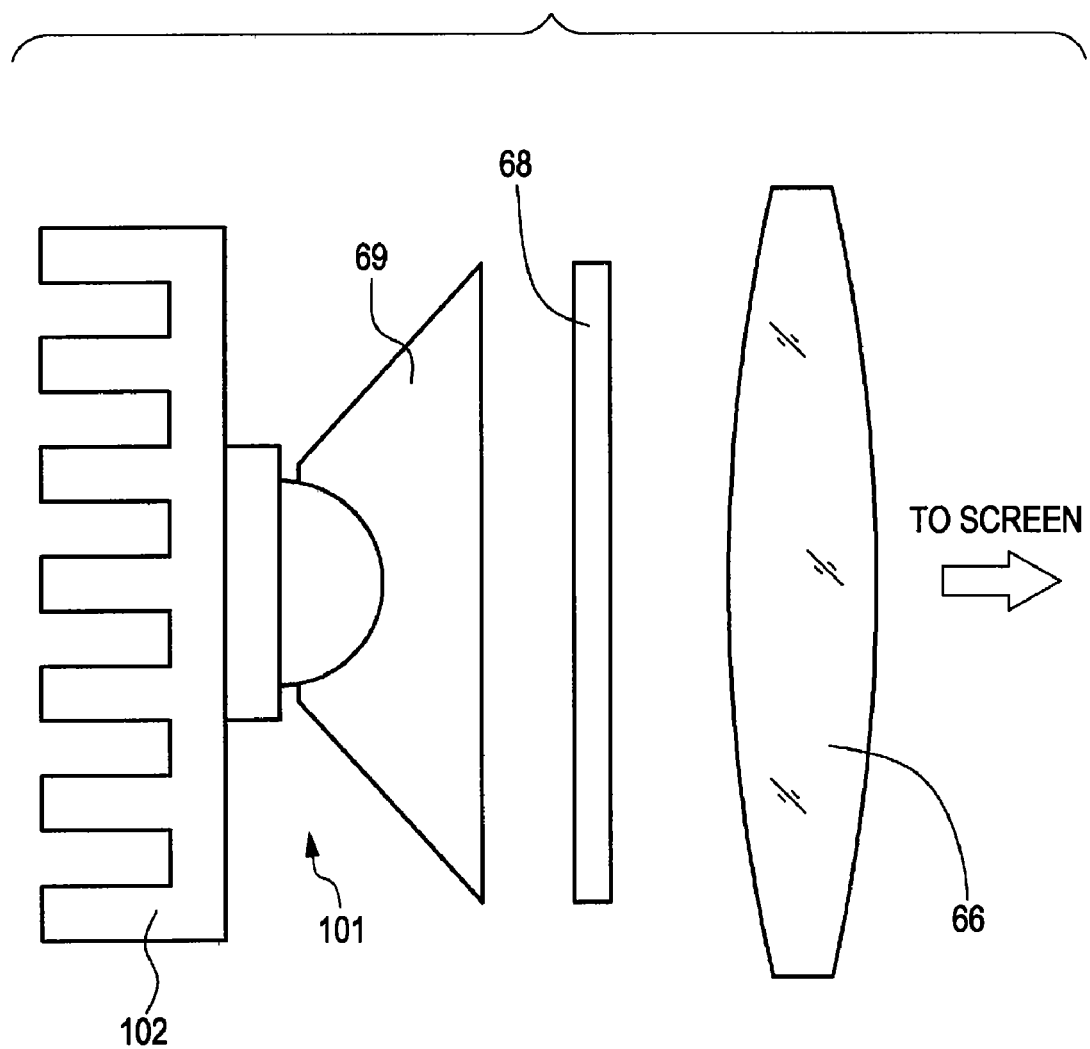
FIG. 16 is a conceptual diagram of a projection image display (image display according to embodiment 1D) including a GaN based semiconductor light-emitting device and a light-passage control device.

The number of GaN based semiconductor light-emitting devices may be determined on the basis of specifications of the image display and may be one or more. In FIG. 16 showing a conceptual diagram of an image display, the number of GaN based semiconductor light-emitting device 101 is one. The GaN based semiconductor light-emitting device 101 is attached to a heat sink 102. Light emitted from the GaN based semiconductor light-emitting device 101 is guided with a light guide composed of a light-transmitting material, such as a silicone resin, an epoxy resin, or a polycarbonate resin, or a light guide 69 including a reflector such as a mirror to enter the liquid crystal display 68. In a direct-view image display, light emitted from the liquid crystal display 68 is directly viewed. In a projection image display, light emitted from the liquid crystal display 68 is projected on a screen through the projector lens 66. The GaN based semiconductor light-emitting device 1 described in EXAMPLE 1 or 2 may be used as the GaN based semiconductor light-emitting device 101.

Figure 17:
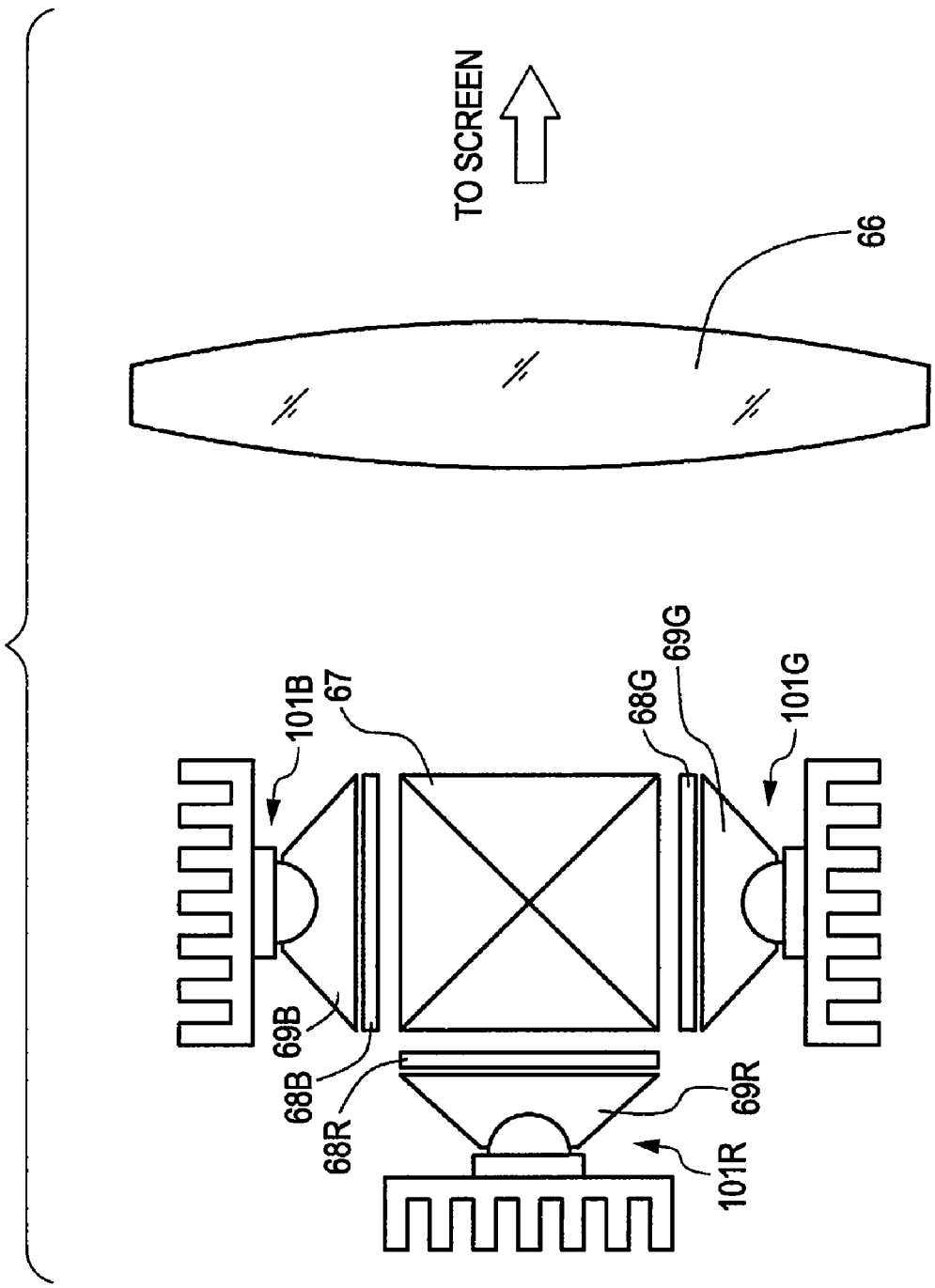
FIG. 17 is a conceptual diagram of a projection color image display (image display according to embodiment 1D) consisting of three pairs of semiconductor light-emitting devices, which include a GaN based semiconductor light-emitting device, and light-passage control devices.

An image display includes a red-light-emitting semiconductor device 101R, such as a AlGaInP based semiconductor light-emitting device or a GaN based semiconductor light-emitting device or the like; a light-passage control device, such as a light valve, e.g., a liquid crystal display 68R, which is a kind of a light valve, for controlling the passage of outgoing light emitted from the red-light-emitting semiconductor device 101R; a GaN based semiconductor green-light-emitting device 101G; a light-passage control device, such as a light valve, e.g., a liquid crystal display 68G, which is a kind of a light valve, for controlling the passage of outgoing light emitted from the GaN based semiconductor green-light-emitting device 101G; a GaN based semiconductor blue-light-emitting device 101B; a light-passage control device, such as a light valve, e.g., a liquid crystal display 68B, which is a kind of a light valve, for controlling the passage of outgoing light emitted from the GaN based semiconductor blue-light-emitting device 101B; light guides 69R, 69G, and 69B for guiding light rays emitted from these GaN based semiconductor light-emitting devices 101R, 101G, and 101B; and a unit (for example, dichroic prism 67) that combines light rays into a single optical path. A direct-view or projection color image display may be produced using the structure. FIG. 17 is a conceptual diagram of a projection color image display.

In such an image display, the GaN based semiconductor light-emitting devices 1 described in EXAMPLE 1 or 2 are preferably used as the semiconductor light-emitting devices 101R, 101G, and 101B. In some cases, for example, an AlInGaP based compound semiconductor light-emitting diode may be used as the red-light-emitting semiconductor device 101R, and the GaN based semiconductor light-emitting devices 1 described in EXAMPLE 1 or 2 may be used as the semiconductor light-emitting devices 101G and 101B.

(6) Image Display According to Embodiment 1E

A direct-view or projection image display including:

(α) the light-emitting device panel 60 having GaN based semiconductor light-emitting devices 1 arrayed in a matrix in a plane; and (β) a light-passage control device, such as a light valve, e.g., a liquid crystal display 68, for controlling the passage of outgoing light emitted from the GaN based semiconductor light-emitting devices 1, wherein the passage of outgoing light emitted from the GaN based semiconductor light-emitting devices 1 is controlled by the light-passage control device, such as the liquid crystal display 68, to display an image.

Figure 18:
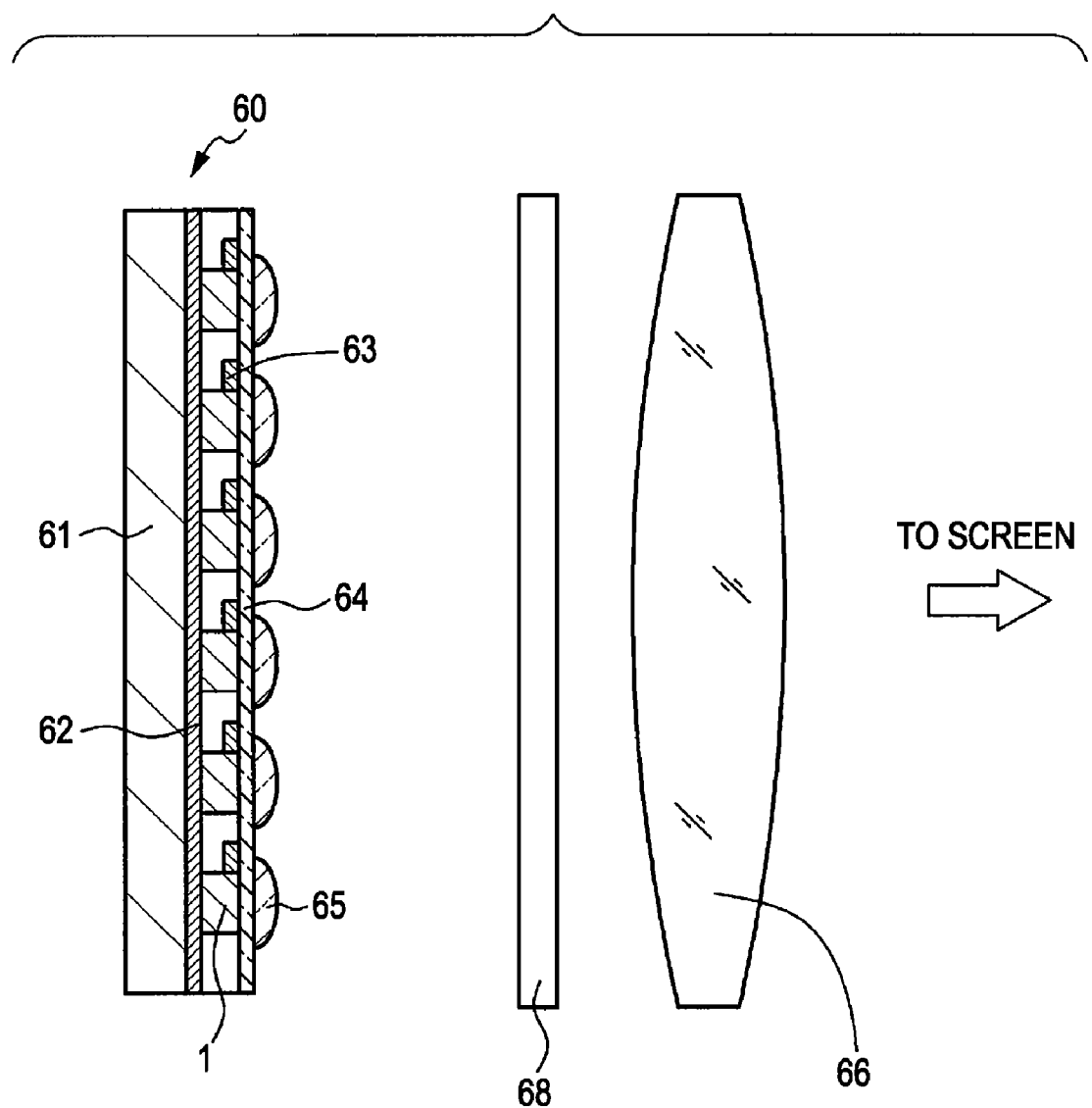
FIG. 18 is a conceptual diagram of a projection image display (image display according to embodiment 1E) including a light-emitting device panel and a light-passage control device.

FIG. 18 is a conceptual diagram of the light-emitting device panel 60 and the like. The light-emitting device panel 60 has the same structure as that of the light-emitting device panel 60 described with reference to FIG. 12B. Thus, the detailed description is omitted. The passage and brightness of light emitted from the light-emitting device panel 60 are controlled by operation of the liquid crystal display 68. Thus, the GaN based semiconductor light-emitting devices 1 constituting the light-emitting device panel 60 may always illuminate. Alternatively, a turn ON/OFF cycle may be repeated in appropriate periods. Then, light emitted from the light-emitting device panel 60 enters the liquid crystal display 68. In a direct-view image display, light emitted from the liquid crystal display 68 is directly viewed. In a projection image display, light emitted from the liquid crystal display 68 is projected on a screen through the projector lens 66.

(7) Image Display According to Embodiment 1F

A direct-view or projection color image display including:

(α) a red-light-emitting device panel 60R having red-light-emitting semiconductor devices 1R (AlGaInP based semiconductor light-emitting devices, GaN based light-emitting semiconductor devices, or the like) arrayed in a matrix in a plane and a red-light-passage control device, such as light valve, e.g., liquid crystal display 68R, for controlling passage of outgoing light emitted from the red-light-emitting-device panel 60R;

(β) a green-light-emitting device panel 60G having GaN based semiconductor green-light-emitting devices 1G arrayed in a matrix in a plane and a green-light-passage control device, such as light valve, e.g., liquid crystal display 68G, for controlling passage of outgoing light emitted from the green-light-emitting-device panel 60G;

(γ) a blue-light-emitting device panel 60B having GaN based semiconductor blue-light-emitting devices 1B arrayed in a matrix in a plane and a blue-light-passage control device, such as light valve, e.g., liquid crystal display 68B, for controlling passage of outgoing light emitted from the blue-light-emitting-device panel 60B; and (δ) a unit (for example, dichroic prism 67) that combines light rays passing through the red-light-passage control device 68R, the green-light-passage control device 68G, and the blue-light-passage control device 68B into a single optical path, wherein the passage of outgoing light rays emitted from the light-emitting panels 60R, 60G, and 60B is controlled by the light-passage control devices 68R, 68G, and 68B to display an image.

Figure 19:
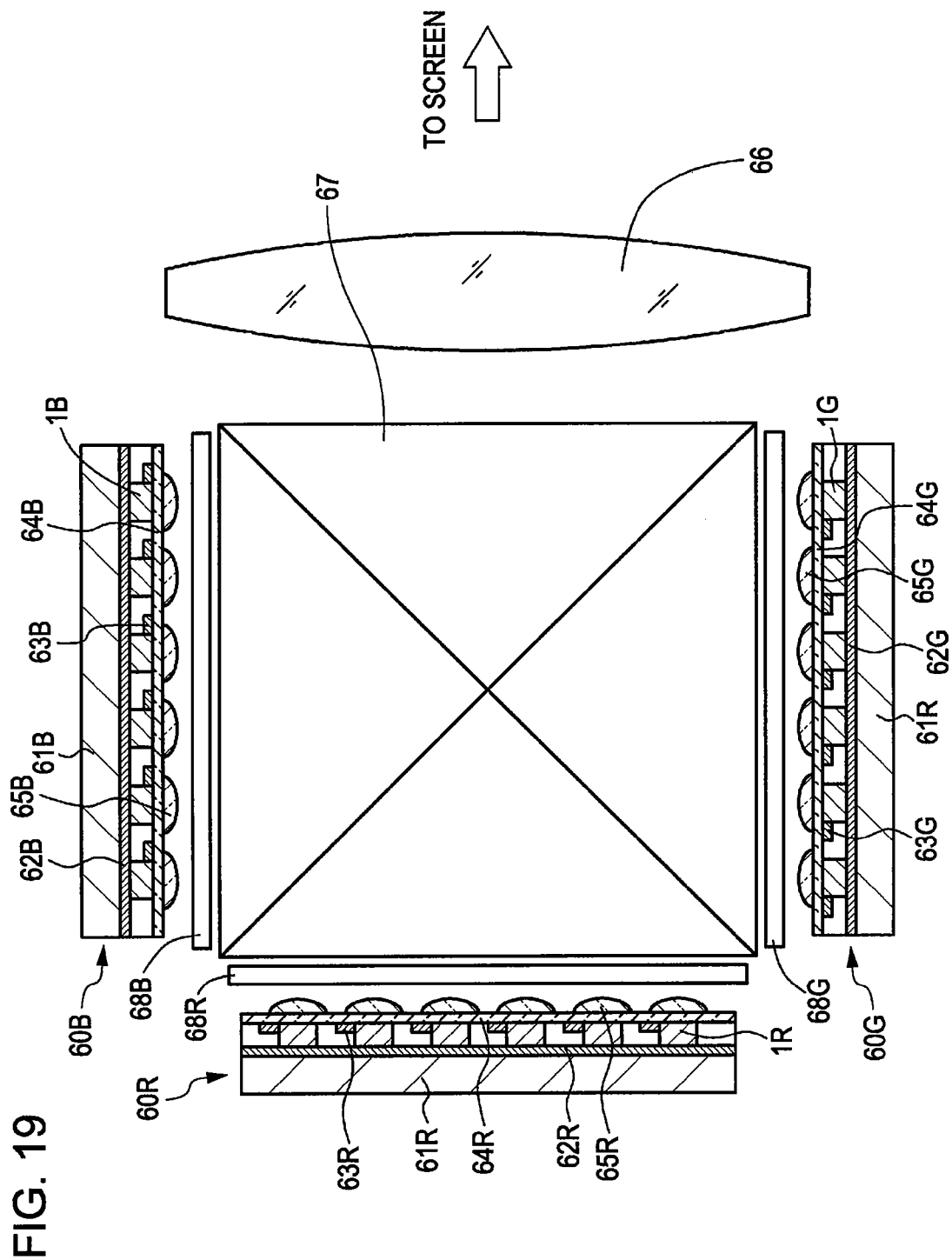
FIG. 19 is a conceptual diagram of a projection color image display (image display according to embodiment 1F) consisting of three pairs of semiconductor light-emitting devices, which include a GaN based semiconductor light-emitting device, and light-passage control devices.

FIG. 19 is a conceptual diagram of the light-emitting device panels 60R, 60G, and 60B having the GaN based semiconductor light-emitting devices 1R, 1G, and 1B arrayed in a matrix in a plane. The passage of light rays emitted from the light-emitting device panels 60R, 60G, and 60B is controlled by the light-passage control devices 68R, 68G, and 68B. The light rays enter the dichroic prism 67 to combine a single optical path. In a direct-view image display, the light is directly viewed. In a projection image display, light emitted from the liquid crystal display 68 is projected on a screen through the projector lens 66. The light-emitting device panels 60R, 60G, and 60B have the same structure as that of the light-emitting device panel 60 described with reference to FIG. 12B. Thus, the detailed description is omitted.

In such an image display, the GaN based semiconductor light-emitting devices 1 described in EXAMPLE 1 or 2 are preferably used as the GaN based semiconductor light-emitting devices 1R, 1G, and 1B constituting the light-emitting device panels 60R, 60G, and 60B. In some cases, for example, AlInGaP based compound semiconductor light-emitting diodes may be used as the red-light-emitting semiconductor devices 1R constituting the red-light-emitting-device panel 60R, and the GaN based semiconductor light-emitting devices 1 described in EXAMPLE 1 or 2 may be used as the light-emitting semiconductor devices 1G and 1B constituting the light-emitting device panels 60G and 60B.

(8) Image Display According to Embodiment 1G

A field-sequential color image display (direct-view or projection) including:

(α) a red-light-emitting semiconductor device 1R, such as an AlGaInP based semiconductor light-emitting device or a GaN based light-emitting semiconductor device;

(β) a GaN based semiconductor green-light-emitting device 1G;

(γ) a GaN based semiconductor blue-light-emitting device 1B;

(δ) a unit (for example, the dichroic prism 67) that combines light rays emitted from the red-light-emitting semiconductor device 1R, the GaN based semiconductor green-light-emitting device 1G, and the GaN based semiconductor blue-light-emitting device 1B into a single optical path; and (ε) a light-passage control device, such as a light valve, e.g., the liquid crystal display 68, for controlling the passage of light emitted from the unit, such as the dichroic prism 67), wherein the passage of the outgoing light rays emitted from these light-emitting devices is controlled by the light-passage control device 68 to display an image.

Figure 20:
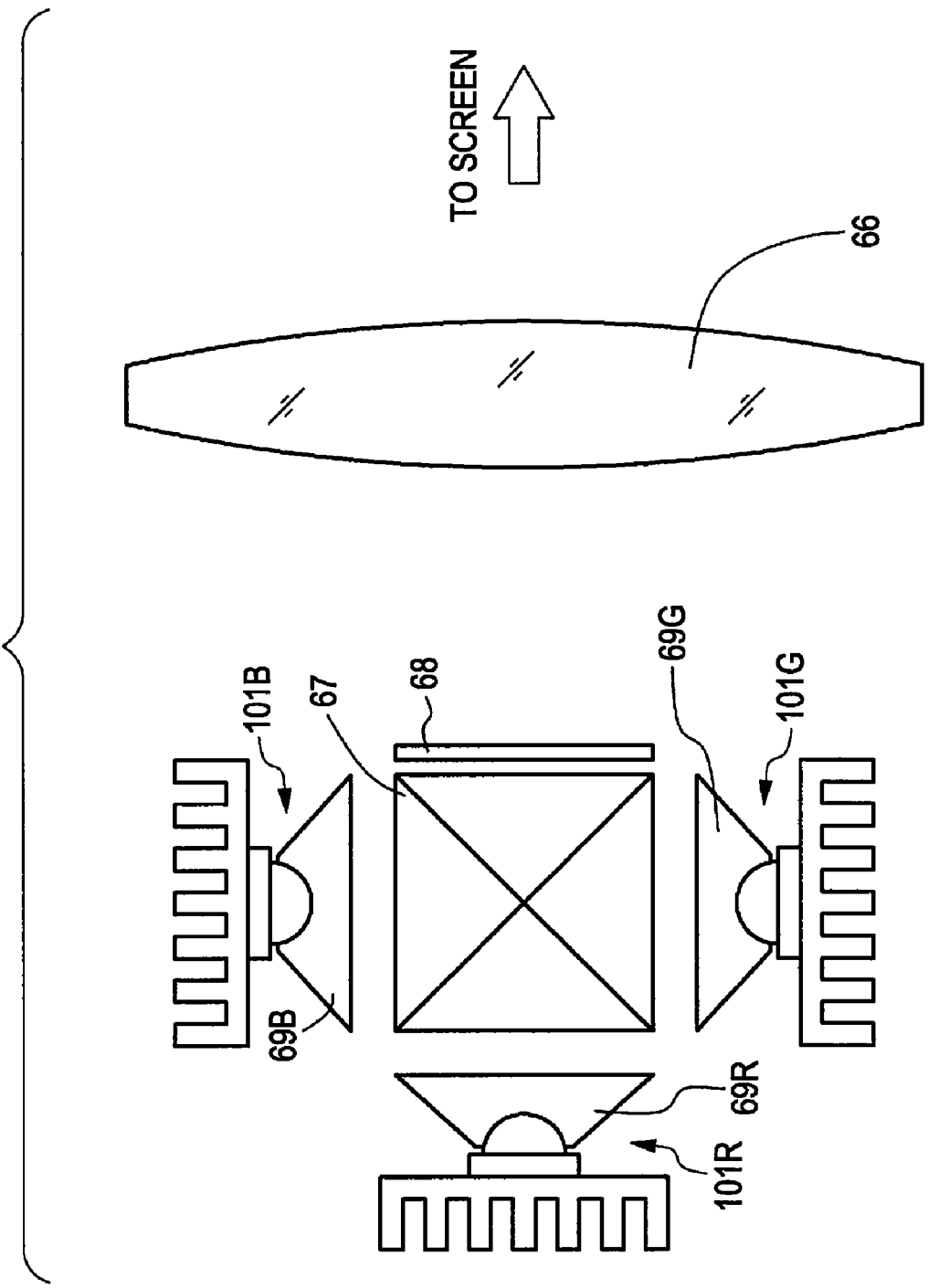
FIG. 20 is a conceptual diagram of a projection color image display (image display according to embodiment 1G) consisting of three semiconductor light-emitting devices, which include a GaN based semiconductor light-emitting device, and a light-passage control device.

FIG. 20 is a conceptual diagram of the semiconductor light-emitting devices 101R, 101G, and 101B. Light rays emitted from the semiconductor light-emitting devices 101R, 101G, and 101B are incident on the dichroic prism 67. The optical paths of these light rays are combined into a single optical path. Then, the dichroic prism 67 emits light rays. The passage of these light rays is controlled by the light-passage control device 68. In a direct view image display, the light rays are viewed. In a projection image display, the light rays are projected on a screen through the projector lens 66. In such an image display, the GaN based semiconductor light-emitting devices 1 described in EXAMPLE 1 or 2 are preferably used as the semiconductor light-emitting devices 101R, 101G, and 101B. In some cases, for example, an AlInGaP based compound semiconductor light-emitting diode may be used as the light-emitting semiconductor device 101R, and the GaN based semiconductor light-emitting devices 1 described in EXAMPLE 1 or 2 may be used as the light-emitting semiconductor devices 101G and 101B.

(9) Image Display According to Embodiment 1H

A field-sequential color image display (direct-view or projection) including:

(α) a red-light-emitting device panel 60R having red-light-emitting semiconductor devices 1R, such as AlGaInP based semiconductor light-emitting devices or GaN based light-emitting semiconductor devices, arrayed in a matrix in a plane;

(β) a green-light-emitting device panel 60G having GaN based semiconductor green-light-emitting devices 1G arrayed in a matrix in a plane;

(γ) a blue-light-emitting device panel 60B having GaN based semiconductor blue-light-emitting devices 1B arrayed in a matrix in a plane;

(δ) a unit (for example, the dichroic prism 67) that combines light rays emitted from the red-light-emitting-device panel 60R, the green-light-emitting device panel 60G, and the blue-light-emitting device panel 60B into a single optical path; and (ε) a light-passage control device, such as a light valve, e.g., the liquid crystal display 68, for controlling the passage of light emitted from the unit, such as the dichroic prism 67), wherein the passage of the outgoing light rays emitted from these light-emitting device panels 60R, 60G, and 60B is controlled by the light-passage control device 68 to display an image.

Figure 21:
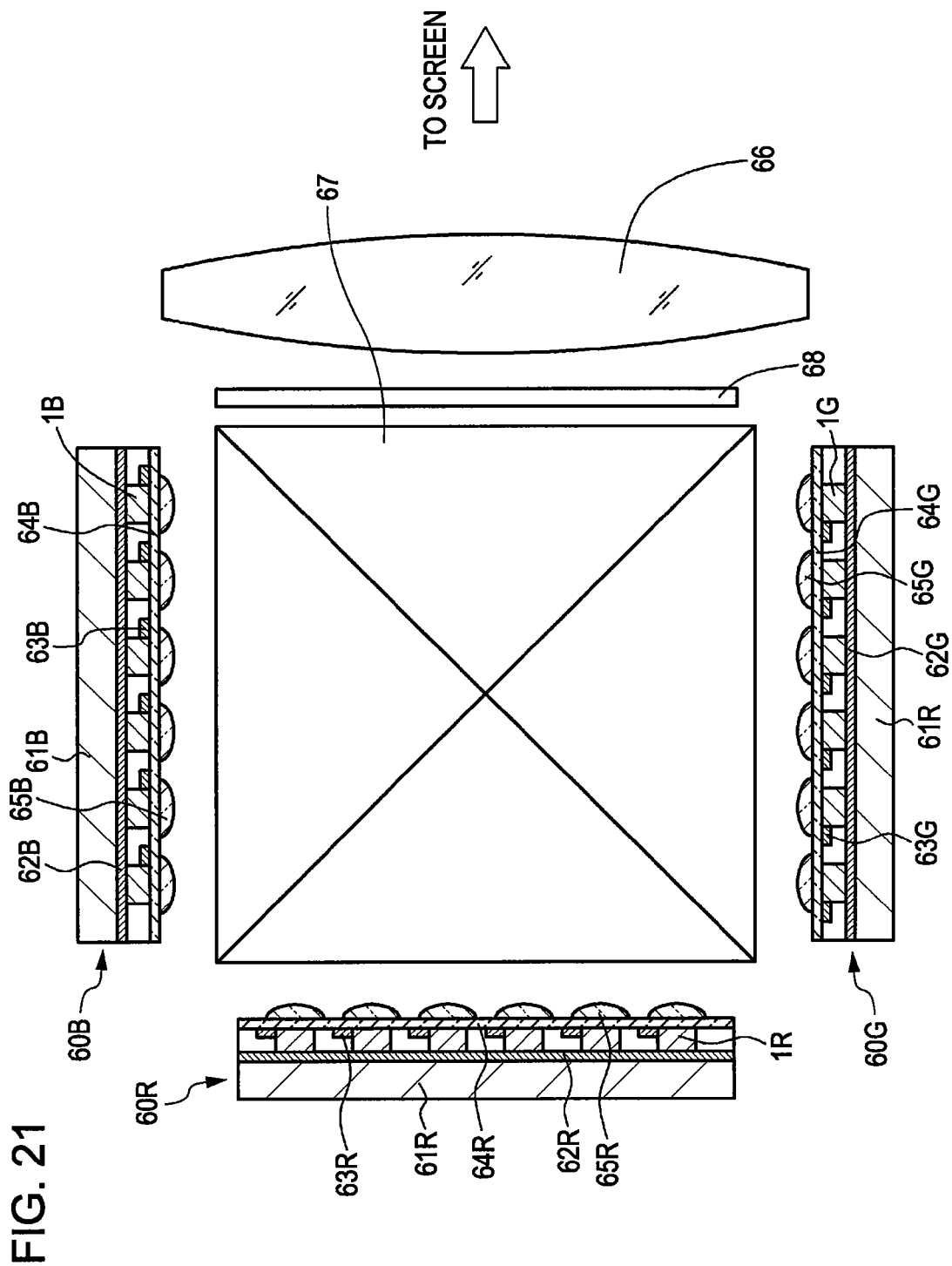
FIG. 21 is a conceptual diagram of a projection color image display (image display according to embodiment 1H) including three light-emitting device panels and a light-passage control device.

FIG. 21 is a conceptual view of the light-emitting device panels 60R, 60G, and 60B having the GaN based semiconductor light-emitting devices 1R, 1G, and 1B arrayed in a matrix in a plane. Light rays emitted from the light-emitting device panels 60R, 60G, and 60B are incident on the dichroic prism 67. The optical paths of these light rays are combined into a single optical path. Then, the dichroic prism 67 emits light rays. The passage of these light rays is controlled by the light-passage control device 68. In a direct view image display, the light rays are viewed. In a projection image display, the light rays are projected on a screen through the projector lens 66. The light-emitting device panels 60R, 60G, and 60B have the same structure as that of the light-emitting device panel 60 described with reference to FIG. 12B. Thus, the detailed description is omitted.

In such an image display, the GaN based semiconductor light-emitting devices 1 described in EXAMPLE 1 or 2 are preferably used as the semiconductor light-emitting devices 1R, 1G, and 1B constituting the light-emitting device panels 60R, 60G, and 60B. In some cases, for example, an AlInGaP based compound semiconductor light-emitting diode may be used as the light-emitting semiconductor devices 1R constituting the light-emitting device panel 60R, and the GaN based semiconductor light-emitting devices 1 may be used as the light-emitting semiconductor devices 1G and 1B constituting the light-emitting device panels 60G and 60B.

EXAMPLE 5

EXAMPLE 5 also relates to an image display. An image display according to EXAMPLE 5 includes a light-emitting device unit UN for displaying a color image and having a first blue-light-emitting device, a second green-light-emitting device, and a third red-light-emitting device, the light-emitting device unit UN being arrayed in a matrix in a plane. The GaN based semiconductor light-emitting device (light-emitting device) constituting at least one light-emitting device selected from the first light-emitting device, the second light-emitting device, and the third light-emitting device has the same structure as that described in EXAMPLE 1 or 2.

In such an image display, any one of the first light-emitting device, the second light-emitting device, and the third light-emitting device is preferably the GaN based semiconductor light-emitting device 1 described in EXAMPLE 1 or 2. In some cases, for example, an AlInGaP based compound semiconductor light-emitting diode may be used as the red-light-emitting device.

Examples of the image display according to EXAMPLE 5 include image displays having structures described below. The number of light-emitting device units UN may be determined on the basis of specifications of the image display. The image display may further have a light valve on the basis of the specifications.

(1) Image Display According to Embodiment 2A and 2B

A passive-matrix or active-matrix direct-view color image display, in which emitting and nonemitting states of each of the first light-emitting device, the second light-emitting device, and the third light-emitting device are controlled such that an observer directly visually identifies the emitting state of each light-emitting device to recognize an image; and a passive-matrix or active-matrix projection color image display, in which emitting and nonemitting states of each of the first light-emitting device, the second light-emitting device, and the third light-emitting device are controlled, and controlled light is projected on a screen to display an image.

Figure 22:
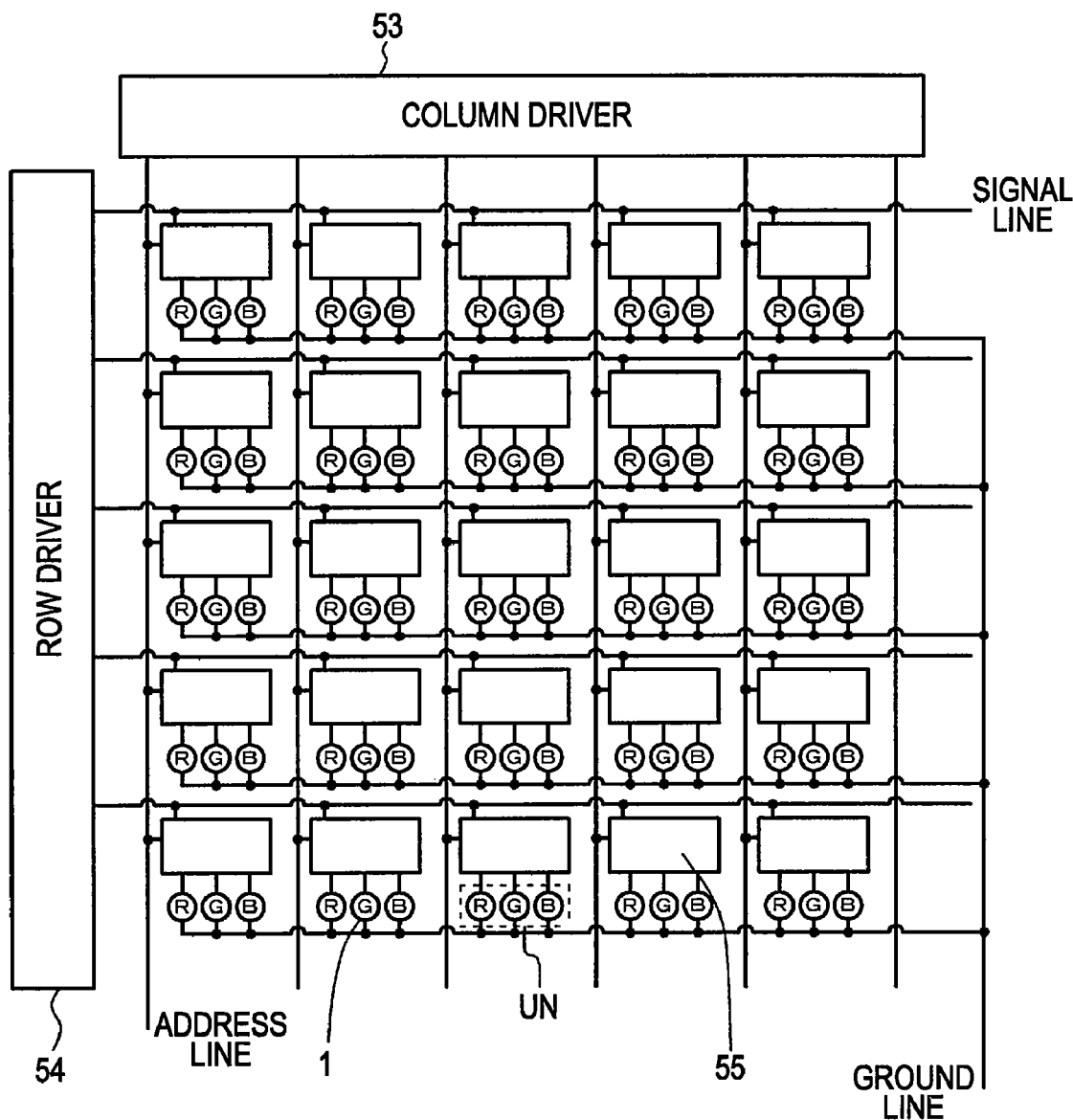
FIG. 22 is a circuit diagram of an active-matrix direct-view color image display (image display according to embodiment 2A) according to EXAMPLE 5.

FIG. 22 is a circuit diagram of a light-emitting device panel constituting such an active-matrix direct-view color image display, wherein R represents a light-emitting semiconductor device that emits red light, G represents a GaN based semiconductor light-emitting device that emits green light, and B represents a GaN based semiconductor light-emitting device that emits blue light. One electrode (p-type electrode or n-type electrode) of each GaN based semiconductor light-emitting device 1 is connected to individual drivers 55. The drivers 55 are each connected to a column driver 53 and a row driver 54. The other electrode (n-type electrode or p-type electrode) of each GaN based semiconductor light-emitting device 1 is connected to a ground line. The emitting/nonemitting state of each GaN based semiconductor light-emitting device 1 is controlled by, for example, selecting the drivers 55 by the row driver 54. The column driver 53 sends a luminance signal for operating each GaN based semiconductor light-emitting device 1 to the corresponding driver 55. A predetermined voltage from a power supply (not shown) is applied to the drivers 55. The drivers 55 feed operating currents corresponding to the luminance signals (on the basis of PDM control or PWM control) to the GaN based semiconductor light-emitting devices 1. One of the functions of the column driver 53 is the same function as that of the driving circuit 36 in EXAMPLE 1. Selection among the light-emitting semiconductor device R that emits red light, the GaN based semiconductor light-emitting device G that emits green light, and the GaN based semiconductor light-emitting device B that emits blue light is performed using the drivers 55. Emitting and nonemitting states of each of the light-emitting semiconductor device R that emits red light, the GaN based semiconductor light-emitting device G that emits green light, and the GaN based semiconductor light-emitting device B that emits blue light may be controlled in a time-sharing manner. Alternatively, these devices may illuminate at the same time. Selection and operation of each GaN based semiconductor light-emitting device 1 can be performed by the known method. Thus, the detailed description is omitted. In a direct-view image display, light is directly viewed. In a projection image display, light is projected on a screen through a projector lens.

(2) Image Display According to Embodiment 2C

A field-sequential direct-view or projection color image display including a light-passage control device, such as a light valve, e.g., a liquid crystal display, for controlling passage of outgoing light emitted from a light-emitting device unit arrayed in a matrix in a plane, wherein the emitting and nonemitting states of the first light-emitting device, the second light-emitting device, and the third light-emitting device in each light-emitting device unit are controlled in a time-sharing manner, and the passage of light rays emitted from the first light-emitting device, the second light-emitting device, and the third light-emitting device is controlled using the light-passage control device to display an image.

A conceptual diagram of such a image display is the same as that shown in FIG. 14. In a direct-view image display, light is directly viewed. In a projection image display, light is projected on a screen through a projector lens.

EXAMPLE 6

EXAMPLE 6 relates to a surface-emitting light-source apparatus and a liquid crystal display assembly (specifically, a color liquid crystal display assembly). The surface-emitting light-source apparatus according to EXAMPLE 6 illuminates a transmissive or semi-transmissive color liquid crystal display from the backside. The color liquid crystal display assembly according to EXAMPLE 6 includes a transmissive or semi-transmissive color liquid crystal display; and a surface-emitting light-source apparatus that illuminates the color liquid crystal display from the backside.

The basic structure of the GaN based semiconductor light-emitting device (light-emitting device) is identical to that described in EXAMPLE 1 or 2.

Figure 23A:
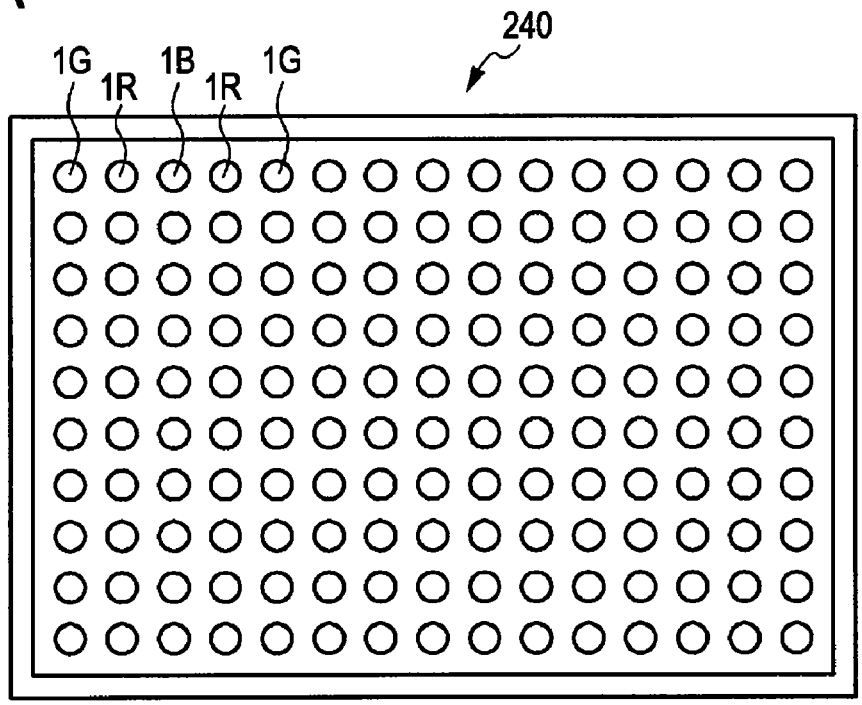
FIG. 23A is a schematic view showing the arrangement of light-emitting devices in a surface-emitting light-source unit according to EXAMPLE 6.
Figure 23B:
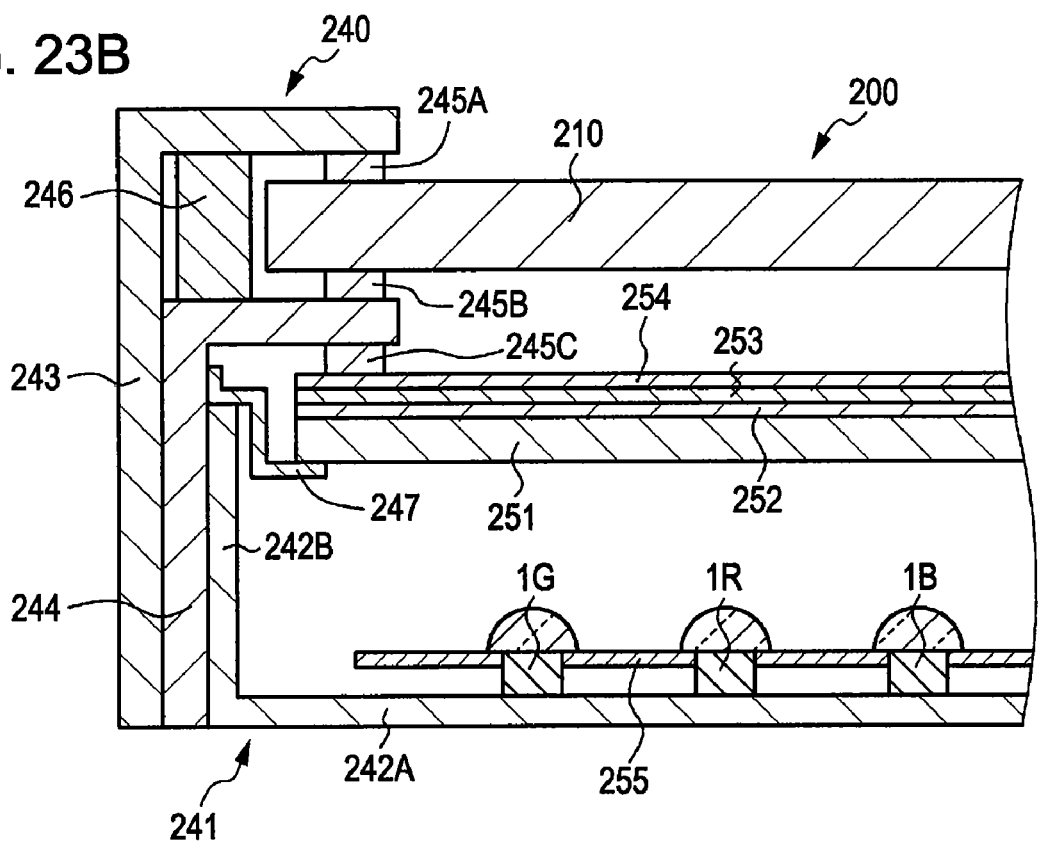
FIG. 23B is a schematic fragmentary cross-sectional view of the surface-emitting light-source unit and a color liquid crystal display assembly.
Figure 24:
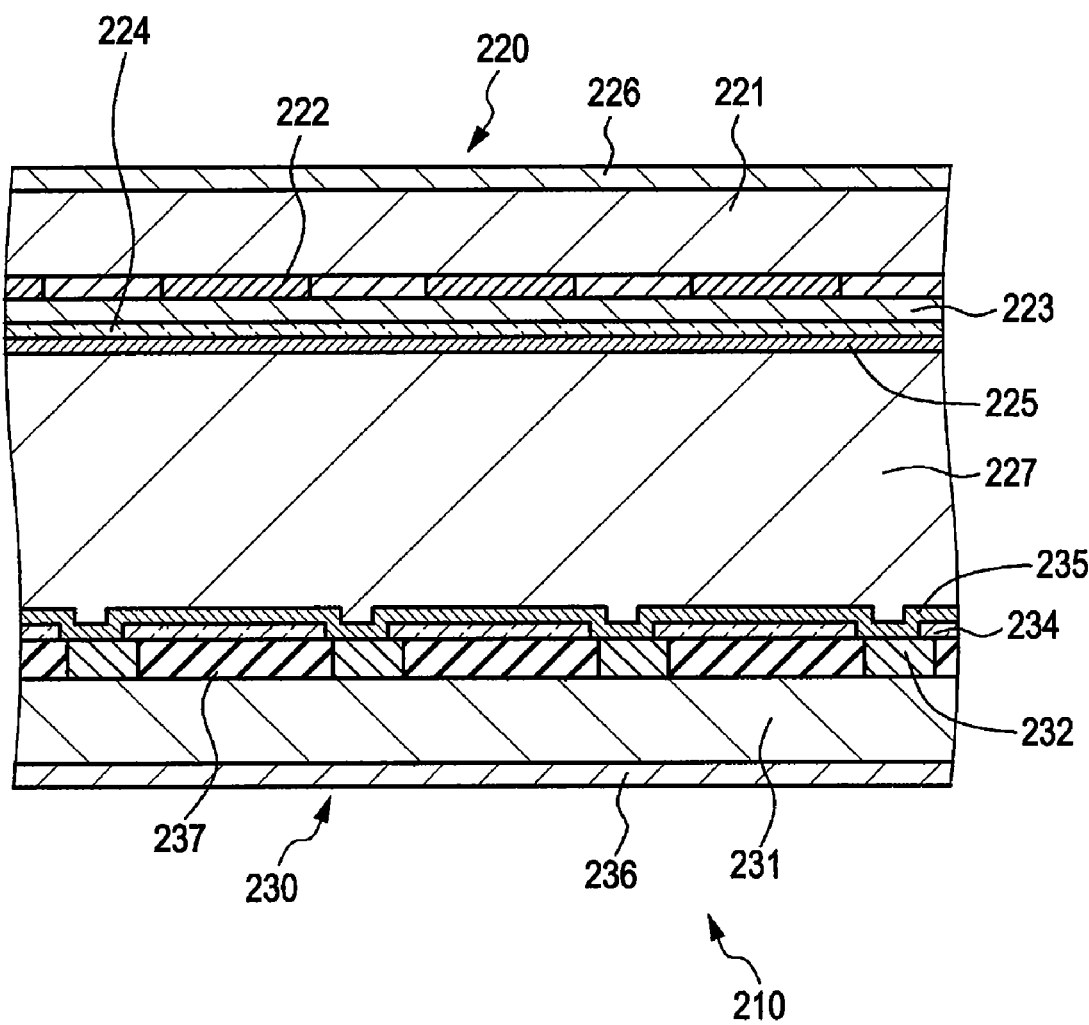
FIG. 24 is a schematic fragmentary cross-sectional view of a color liquid crystal display.

FIG. 23A is a schematic view showing the arrangement of light-emitting devices in a surface-emitting light-source apparatus according to EXAMPLE 6. FIG. 23B is a schematic fragmentary cross-sectional view of the surface-emitting light-source apparatus and a color liquid crystal display assembly. FIG. 24 is a schematic fragmentary cross-sectional view of a color liquid crystal display.

Specifically, a color liquid crystal display assembly 200 according to EXAMPLE 6 includes:

a transmissive color liquid crystal display 210 including:

(a) a front panel 220 having a first transparent electrode 224;

(b) a rear panel 230 having a second transparent electrode 234; and (c) a liquid-crystal material 227 disposed between the front panel 220 and the rear panel 230; and (d) a surface-emitting light-source apparatus 240 having semiconductor light-emitting devices 1R, 1G, and 1B as a light source (direct backlight). The surface-emitting light-source apparatus 240 (direct backlight) faces the rear panel 230 and illuminates the transmissive color liquid crystal display 210 from the rear panel side.

The surface-emitting light-source apparatus 240 (direct backlight) includes a cabinet 241 having an outer frame 243 and an inner frame 244. An end of the transmissive color liquid crystal display 210 is supported with the outer frame 243 and the inner frame 244 via spacers 245A and 245B. A guide member 246 is disposed between the outer frame 243 and the inner frame 244 such that the transmissive color liquid crystal display 210 supported with the outer frame 243 and the inner frame 244 does not deviate. In the cabinet 241, a diffuser plate 251 is attached to the inner frame 244 with a spacer 245C and a bracket member 247 at an upper portion of the cabinet 241. Optically functional sheets, i.e., a diffuser sheet 252, a prism sheet 253, and a polarization conversion sheet 254, are laminated on the diffuser plate 251.

In the cabinet 241, a reflector sheet 255 is disposed at the bottom. The reflecting surface of the reflector sheet 255 faces the diffuser plate 251. The reflector sheet 255 is attached to the bottom 242A of the cabinet 241 with a mounting member (not shown). The reflector sheet 255 may be formed of a silver reflective film having a silver reflective film, a low-refractive index film, and a high-refractive index film stacked in that order on a base sheet. The reflector sheet 255 reflects light emitted from a plurality of AlGaInP based semiconductor light-emitting devices 1R that emit red light having a wavelength of, for example, 640 nm, a plurality of GaN based semiconductor light-emitting devices 1G that emit green light having a wavelength of, for example, 530 nm, and a plurality of GaN based semiconductor light-emitting devices 1B that emit blue light having a wavelength of 450 nm; and light reflected from a side face 242B of the cabinet 241. In this way, red light, green light, and blue light emitted from the plurality of semiconductor light-emitting devices 1R, 1G, and 1B are mixed to form white light with high color purity, the white light being used for illumination. This light for illumination passes through the optically functional sheets, i.e., the diffuser plate 251, the diffuser sheet 252, the prism sheet 253, and the polarization conversion sheet 254, and illuminates the transmissive color liquid crystal display 210 from the back side.

Any number of light-emitting devices may be used. The number of light-emitting devices may be determined on the basis of specifications of the surface-emitting light source apparatus. With respect to the arrangement of the light-emitting devices, for example, a light-emitting device group is defined as a combination of an AlGaInP based semiconductor light-emitting device 1R that emits red light, a GaN based semiconductor light-emitting device 1G that emits green light, and a GaN based semiconductor light-emitting device 1B that emits blue light. A plurality of light-emitting device groups are aligned in the horizontal direction to form a light-emitting device group array. A plurality of light-emitting device group arrays may be arranged in the vertical direction. Examples of the light-emitting device group include a combination of one semiconductor red-light-emitting device, one GaN based semiconductor green-light-emitting device, and one GaN based semiconductor blue-light-emitting device; a combination of one semiconductor red-light-emitting device, two GaN based semiconductor green-light-emitting devices, and one GaN based semiconductor blue-light-emitting device; and a combination of two semiconductor red-light-emitting devices, two GaN based semiconductor green-light-emitting devices, and one GaN based semiconductor blue-light-emitting device. Light-emitting devices that emit light of a fourth color different from red, green, and blue may be further provided. For example, the GaN based semiconductor light-emitting device may have a light taking-out lens described in Nikkei Electronics Dec. 20, 2004, No. 889, p. 128.

As shown in FIG. 24, the front panel 220 constituting the transmissive color liquid crystal display 210 includes a first substrate 221, such as a glass substrate or a silicon substrate; and a polarization film 226 disposed on the outer surface of the first substrate 221. A color filter 222 coated with an overcoat layer 223 composed of an acrylic resin or an epoxy resin is disposed on the inner surface of the first substrate 221. A first transparent electrode 224 (also referred to as "common electrode") composed of indium tin oxide (ITO) or the like is disposed on the overcoat layer 223. An oriented film 225 is disposed on the first transparent electrode 224. Examples of the arrangement pattern of the color filter 222 include a delta arrangement, a striped arrangement, a diagonal arrangement, and a rectangular arrangement. On the other hand, specifically, the rear panel 230 includes a second substrate 231, such as a glass substrate or a silicon substrate; switching elements 232 (specifically, thin-film transistors (TFT)) disposed on the inner surface of the second substrate 231; second transparent electrodes 234 (also referred to as "pixel electrodes) composed of ITO or the like, the continuity/discontinuity of the second transparent electrode 234 being controlled by the switching elements 232; and a polarization film 236 disposed on the outer surface of the second substrate 231. An oriented film 235 covers the entire surface including the second transparent electrodes 234. The front panel 220 is connected to the rear panel 230 at the periphery thereof with a sealant (not shown). The switching elements 232 are not limited to TFTs. Examples of the switching elements include three-terminal elements, such as MOSFETs; and two terminal elements, such as MIM elements, varistor elements, and diodes. An insulating layer 237 is disposed between the switching elements 232.

The known components and materials may be used for the components and the liquid crystal material constituting the transmissive color liquid crystal display. Thus, a detailed description is omitted.

Each of the red-light-emitting semiconductor devices 1R, the GaN based semiconductor green-light-emitting devices 1G, and GaN based semiconductor blue-light-emitting devices 1B has a structure described in EXAMPLE 1 or 2 and connected to the driving circuit 36. The devices are operated in the same way described in EXAMPLE 1.

The region of the surface-emitting light-source apparatus is divided into a plurality of sections, and each section is dynamically controlled, thereby further expanding a dynamic range on luminance of the color liquid crystal display. That is, the region of the surface-emitting light-source apparatus is divided into a plurality of sections every image display frame. The brightness of each section of the surface-emitting light-source apparatus is changed in response to an image signal (for example, the luminance of the corresponding section of the surface-emitting light-source apparatus is proportioned to the maximum luminance in a portion of an image corresponding to each section). Thus, at a bright portion of an image, the luminance of the corresponding section of the surface-emitting light-source apparatus is increased. At a dark portion of an image, the luminance of the corresponding section of the surface-emitting light-source apparatus is reduced. Thereby, it is possible to significantly increase the contrast ratio of the color liquid crystal display. Furthermore, mean power consumption can be reduced. Specifically, for example, luminance control of each section of the surface-emitting light-source apparatus may be performed by control of a pulse width and/or pulse density of the operating current.

EXAMPLE 7

Figure 25:
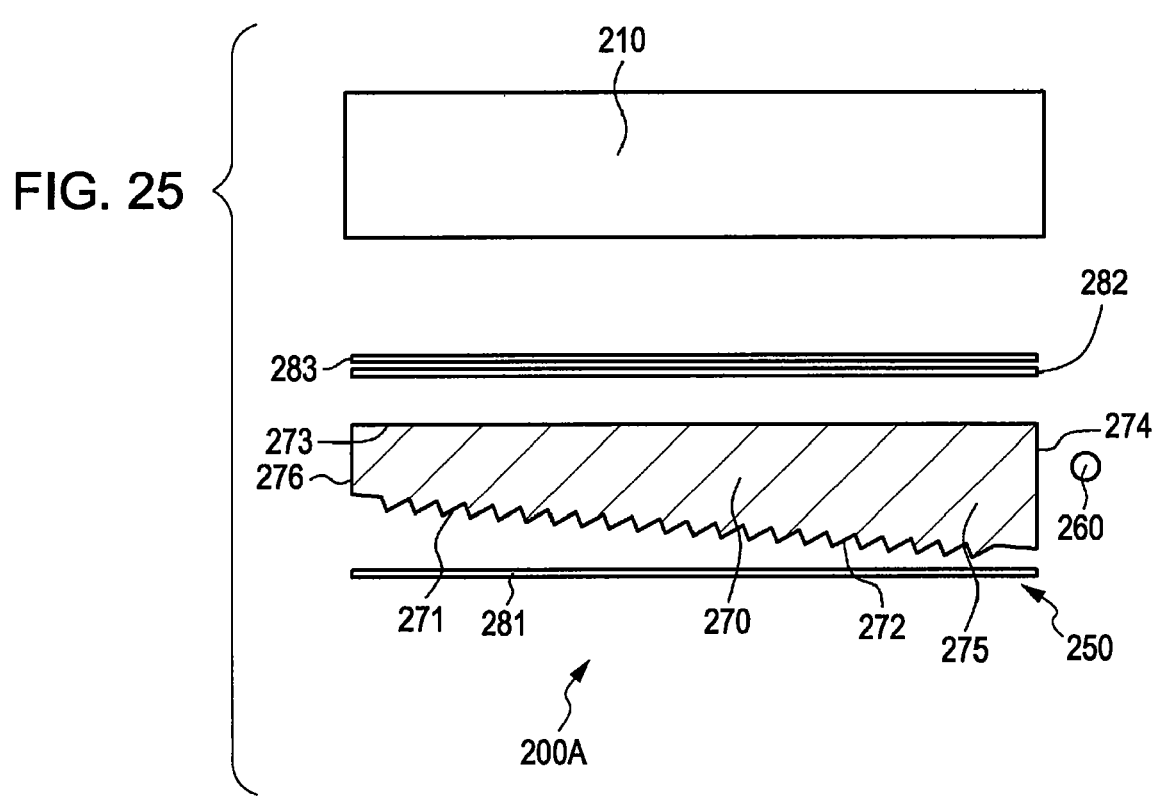
FIG. 25 is a conceptual diagram of a color liquid crystal display assembly according to EXAMPLE 7.

EXAMPLE 7 is a modification of EXAMPLE 6. In EXAMPLE 6, the surface-emitting light-source apparatus is a direct backlight. On the other hand, in EXAMPLE 7, the surface-emitting light-source apparatus is of an edge-lighting type. FIG. 25 is a conceptual diagram of a color liquid crystal display assembly according to EXAMPLE 7. A schematic fragmentary cross-sectional view of the color liquid crystal display assembly according to EXAMPLE 7 is the same as the schematic fragmentary cross-sectional view shown in FIG. 24.

A color liquid crystal display assembly 200 according to EXAMPLE 7 includes:

a transmissive color liquid crystal display 210 including:

(a) a front panel 220 having a first transparent electrode 224;

(b) a rear panel 230 having a second transparent electrode 234; and (c) a liquid-crystal material 227 disposed between the front panel 220 and the rear panel 230; and (d) a surface-emitting light-source apparatus 250 (edge-lighting type backlight) having a light guide 270 and a light source 260 to illuminate the color liquid crystal display 210 from the rear panel side. The light guide 270 faces the rear panel 230.

For example, the light source 260 includes an AlGaInP based semiconductor red-light-emitting device, a GaN based semiconductor green-light-emitting device, and a GaN based semiconductor blue-light-emitting device. These semiconductor light-emitting devices are not shown. The GaN based semiconductor light-emitting devices described in EXAMPLE 1 or 2 may be used as the GaN based semiconductor green-light-emitting device and the GaN based semiconductor blue-light-emitting device. The front panel 220 and the rear panel 230 constituting the transmissive color liquid crystal display 210 each have the same structure as the front panel 220 and the rear panel 230 according to EXAMPLE 6 described with reference to FIG. 24. Thus, the detailed description is omitted.

For example, the light guide 270 has a first face 271 (bottom face), a second face 273 (top face) facing the first face 271, a first side face 274, a second side face 275, a third side face 276 opposite the first side face 274, and a fourth side face opposite the first side face 274. Specifically, the light guide 270 is in the form of wedge-shaped truncated pyramid as a whole. Two side faces opposite each other of the truncated pyramid corresponds to the first face 271 and the second face 273. The bottom face of the truncated pyramid corresponds to the first side face 274. The first face 271 has irregularities 272 on the surface thereof. When the light guide 270 is cut with an assumed plane perpendicular to the first face 271 in a light incident direction to the light guide 270, the resulting continuous cross-sectional shape is in the form of triangle. That is, the irregularities 272 formed on the surface of the first face 271 each have a prism shape. The second face 273 of the light guide 270 may be smooth (that is, the second face 273 may be mirror-finished surface). Alternatively, the second face 273 may have blast grain that has the effect of diffusion (that is, the second face 273 may have fine irregularities). A reflector 281 faces the first face 271 of the light guide 270. The color liquid crystal display 210 is opposite the second face 273 of the light guide 270. Furthermore, a diffuser sheet 282 and a prism sheet 283 are disposed between the color liquid crystal display 210 and the second face 273 of the light guide 270. Light emitted from the light source 260 is incident on the light guide 270 from the first side face 274 (for example, corresponding to the bottom face of truncated pyramid) of the light guide 270, impinges on the irregularities 272 on the first face 271 to scatter, emitted from the first face 271, reflected from the reflector 281, incident on the first face 271 again, emitted from the second face 273, passes through the diffuser sheet 282 and the prism sheet 283, and illuminates the color liquid crystal display 210.

The light guide 270 is preferably composed of a material that has limited absorption of light emitted from the light source. Examples of the material of the light guide include glass, and plastic materials, such as polymethyl methacrylates (PMMAs), polycarbonate resins, an acrylic resins, amorphous polypropylene resins, and styrene resins containing acrylonitrile-styrene (AS) resins. Light emitted from the light source may be directly introduced into the light guide. Alternatively, light may be indirectly introduced into the light guide. In the case of the latter, for example, an optical fiber may be used.

As described above, the first face 271 (bottom face) of the light guide 270 preferably has projections and/or depressions. That is, the first face 271 of the light guide 270 preferably has projections and/or depressions. Alternatively, the first face 271 preferably has projections and depressions. When the projections and depressions are provided, the projection may be continuously connected to the depression. Alternatively, the projection and the depression may be discontinuous. The projections and/or depressions provided on the first face 271 of the light guide 270 may have a structure in which continuous projections and depressions extend in a direction at a predetermined angle to a light incident direction to the light guide 270. In such a structure, when the light guide is cut with an assumed plane perpendicular to the first face 271 in a light incident direction to the light guide 270, continuous cross-sectional shapes of projections or depressions are observed. Examples of the cross-sectional shapes include quadrangles including triangle, square, rectangle, and trapezoid; polygons; and smooth curves including circles, ellipses, parabolas, hyperbolas, and catenaries. The phrase "a direction at a predetermined angle to a light incident direction to the light guide 270" means that when a light incident direction to the light guide 270 is defined as 0°, the direction extends at an angle of 60° to 120° to the light incident direction. Furthermore, the projections and/or depressions provided on the first face 271 of the light guide 270 may have a structure in which discontinuous projections and depressions extend in a direction at a predetermined angle to a light incident direction to the light guide 270. In such a structure, examples of the discontinuous projections or depressions include polygon poles including pyramids, cylindrical columns, triangle poles, and square poles; various smooth curves, such as part of sphere, part of spheroid, part of paraboloid of revolution, and part of hyperboloid of revolution. In the light guide 270, in some cases, the first face 271 may not have the projections and depressions at the periphery of the first face 271. Furthermore, light emitted from the light source is incident on the light guide 270 and impinges the projections or depressions provided on the first face 271 of the light guide 270 to scatter. The height, depth, pitch, shape of the projection or depression provided on the first face 271 of the light guide 270 may be constant or may be changed with distance from the light source. In the latter, for example, the pitch of the projections or depressions may become finer with distance from the light source. The term "pitch of the projections" or "pitch of the depressions" means a pitch of the projections or the depressions along the light incident direction to the light guide 270.

As described above, while the present disclosure is described on the basis of example embodiments, the present application is not limited to these examples. The structures of the GaN based semiconductor light-emitting devices, the light-emitting apparatuses, the image displays, the surface-emitting light-source apparatuses, the color liquid crystal display assemblies including the GaN based semiconductor light-emitting device described in examples are examples. Components, materials, and the like constituting these are also examples. These structures may be changed according to need. The order of lamination in the GaN based semiconductor light-emitting device may be the reverse. In a direct-view image display, an image display capable of projecting an image on human retinas may also be produced.

In the present application, a structure in which the superlattice layer or the second GaN based compound semiconductor layer has high hole concentration is not limited to the periodic stacked structure of the AlGaN sublayers and the GaN sublayers. A periodic stacked structure of AlGaN sublayers having different compositions, a periodic stacked structure of AlGaN sublayers and InGaN sublayers, and a periodic stacked structure of GaN sublayers and InGaN sublayers may be used. The sublayers may have a quaternary mixed-crystal composition. These sublayers may contain a small amount of impurities.

Figure 26:
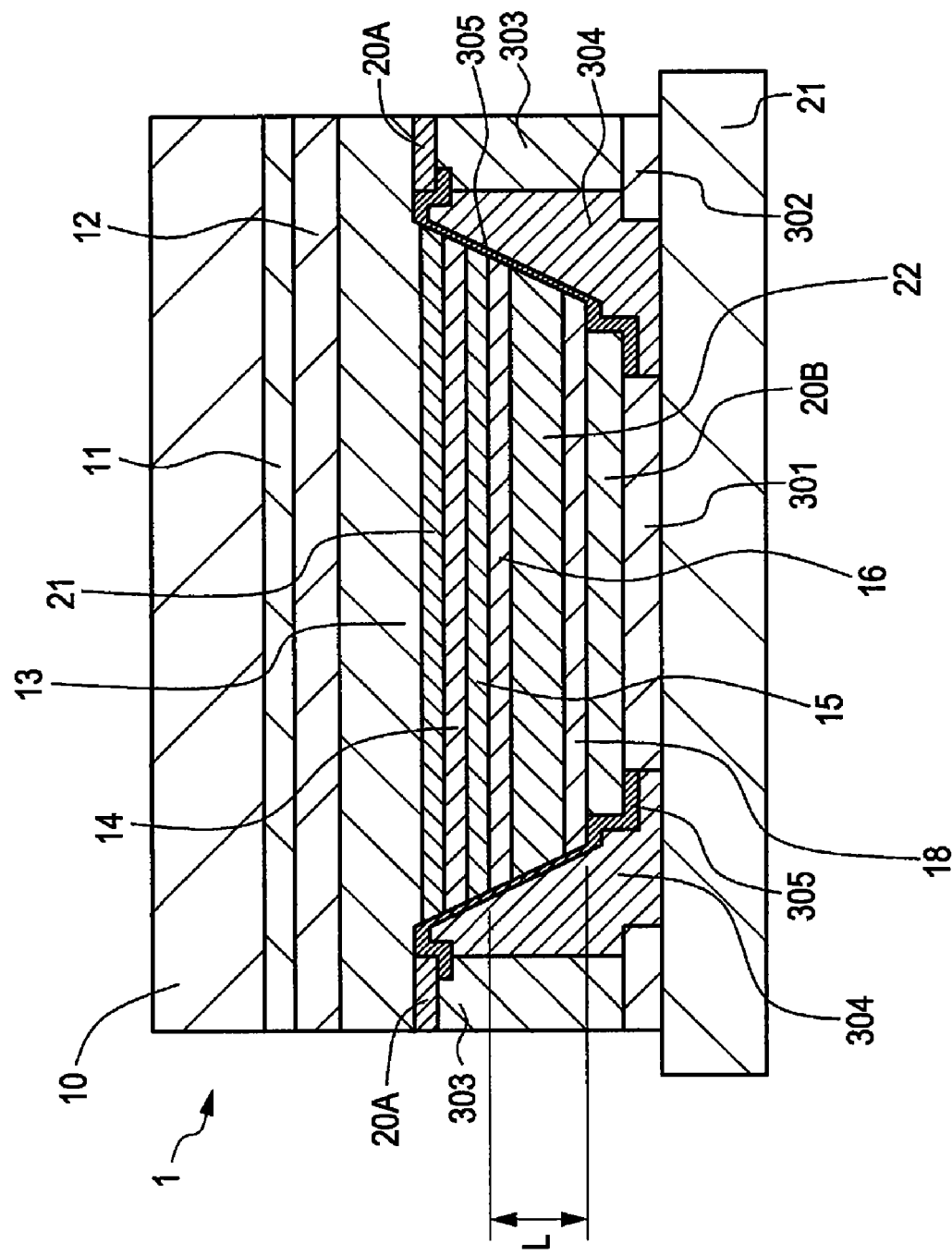
FIG. 26 is a schematic cross-sectional view of a GaN based semiconductor light-emitting device functioning as an LED having a flip-chip structure.

FIG. 26 is a schematic cross-sectional view of the GaN based semiconductor light-emitting device 1 functioning as an LED having a flip-chip structure, wherein the hatch lines are omitted. The layer structure of the GaN based semiconductor light-emitting device 1 may be identical to that of the GaN based semiconductor light-emitting device 1 described in EXAMPLE 1 or 2. The side faces and the like are covered with a passivation film 305. An n-type electrode 20A is disposed on an exposed first GaN based compound semiconductor layer 13. A p-type electrode 20B, which also functions as a light reflecting layer, is disposed on a Mg-doped second GaN based compound semiconductor layer 18. The bottom of the GaN based semiconductor light-emitting device 1 is surrounded by a SiO$_2$ layer 304 and an aluminum layer 303. Furthermore, the p-type electrode 20B and the aluminum layer 303 are fixed on a submount 31 with solder layers 301 and 302. The distance between an active layer 15 and the p-type electrode 20B also functioning as the light reflecting layer is defined as L, the refractive index of a compound semiconductor layer present between the active layer 15 and the p-type electrode 20B is defined as $n_0$, and an emission wavelength is defined as $\lambda$. It is preferred that the following relationship is satisfied:

$$0.5 \times (\lambda/n_0) \leq L \leq (\lambda/n_0).$$

Furthermore, a semiconductor laser may be produced using the GaN based semiconductor light-emitting device. A structure in which the following layers are formed in that order on a GaN substrate may be exemplified as a layer structure of such a semiconductor laser. The laser has an emission wavelength of about 450 nm.

(1) a bulk GaN substrate;

(2) a Si-doped GaN layer having a thickness of 3 µm (doping concentration: $5 \times 10^{18}/cm^3$);

(3) a first GaN based compound semiconductor layer (first cladding layer) of an n-conductivity type, the first GaN based compound semiconductor layer having a total superlattice thickness of 1 µm (when a Si-doped Al$_{0.1}$Ga$_{0.9}$N sublayer having a thickness of 2.4 nm and a Si-doped GaN sublayer having a thickness of 1.6 nm are defined as a pair, the first GaN based compound semiconductor layer consists of 250 pairs; doping concentration: $5 \times 10^{18}/cm^3$);

(4) an underlying layer, which also functions as a light guide layer, composed of Si-doped In$_{0.03}$Ga$_{0.97}$N (Si doping concentration: $5 \times 10^{18}/cm^3$) having a thickness of 150 nm;

(5) a lower spacer layer having a thickness of 5 nm and composed of In$_{0.03}$Ga$_{0.97}$N;

(6) an active layer having a multiple-quantum-well structure (a well sublayer composed of In$_{0.17}$Ga$_{0.83}$N and having a thickness of 3 nm and a barrier sublayer composed of GaN and having a thickness of 5 nm are alternately stacked; the number of well sublayers is 3 and the number of barrier sublayers is 2);

(7) an upper spacer layer having a thickness of 10 nm and composed of undoped GaN;

(8) a superlattice layer having a thickness of 20 nm (when a Mg-doped Al$_{0.2}$Ga$_{0.8}$N sublayer having a thickness of 2.4 nm and a Mg-doped GaN sublayer having a thickness of 1.6 nm are defined as a pair, the superlattice layer consists of 5 pairs; doping concentration: $5 \times 10^{19}/cm^3$);

(9) a Mg-doped GaN layer, which also functions as a light guide layer, having a thickness of 120 nm (Mg doping concentration: $1 \times 10^{19}/cm^3$);

(10) a second GaN based compound semiconductor layer (second cladding layer) of a p-conductivity type, the second GaN based compound semiconductor layer having a total superlattice thickness of 500 nm (when a Mg-doped Al$_{0.1}$Ga$_{0.9}$N sublayer having a thickness of 2.4 nm and a Mg-doped GaN sublayer having a thickness of 1.6 nm are defined as a pair, the second GaN based compound semiconductor layer consists of 125 pairs; doping concentration: $5 \times 10^{19}/cm^3$);

(11) a Mg-doped GaN layer having a thickness of 20 nm (doping concentration: $1 \times 10^{20}/cm^3$); and

(12) a contact layer composed of Mg-doped In$_{0.15}$Ga$_{0.85}$N and having a thickness of 5 nm (doping concentration: $1 \times 10^{20}/cm^3$)

Temperature characteristics (the relationship between the temperature and the emission wavelength) of the AlGaInP based semiconductor light-emitting device and the GaN based semiconductor light-emitting device are determined in advance. By monitoring the temperatures of the AlGaInP based semiconductor light-emitting device and the GaN based semiconductor light-emitting device of the surface-emitting light-source apparatus or the color liquid crystal display assembly, it is possible to stably operate the AlGaInP based semiconductor light-emitting device and the GaN based semiconductor light-emitting device immediately after turn-on.

A driving circuit disclosed in Japanese Unexamined Patent Application Publication No. 2003-22052 may also be used. This driving circuit includes an emission wavelength correction section for correcting a variation in emission wavelength between a plurality of GaN based semiconductor light-emitting devices by controlling a current fed to the GaN based semiconductor light-emitting devices; and a luminance correction section for correcting a variation in luminance between the GaN based semiconductor light-emitting devices. The emission wavelength correction section has current mirror circuits provided for every GaN based semiconductor light-emitting device. The current mirror circuits can control currents flowing through the GaN based semiconductor light-emitting devices. A current flowing through the reference side of the current mirror circuit is controlled by adjusting a current flowing through a plurality of active elements connected in parallel. Furthermore, the luminance correction section has a constant current circuit for feeding a current into GaN based semiconductor light-emitting devices. The luminance correction section can control the ON/OFF state of the switching element for the constant current circuit.

It should be understood by those skilled in the art that various modifications, combinations, sub-combinations and alterations may occur depending on design requirements and other factors insofar as they are within the scope of the appended claims or the equivalents thereof.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A GaN based semiconductor light-emitting device comprising:

a first GaN based compound semiconductor layer of an n-conductivity type;

an active layer;

a second GaN based compound semiconductor layer;

an underlying layer composed of a GaN based compound semiconductor, the underlying layer being disposed between the first GaN based compound semiconductor layer and the active layer, wherein the underlying layer and the active layer each contain In, and the underlying layer has an In content less than an In content of the active layer;

a lower spacer layer composed of an undoped GaN based compound semiconductor, the lower spacer layer having a thickness of 50 nm or less and being disposed between the active layer and the underlying layer; and a superlattice layer composed of a GaN based compound semiconductor doped with a p-type dopant, the superlattice layer being disposed between the active layer and the second GaN based compound semiconductor layer, the superlattice layer having a structure in which a plurality of a first type of GaN based layers are stacked periodically and alternately with a plurality of a second type of GaN based layers.

2. The GaN based semiconductor light-emitting device according to claim 1, further comprising:

an upper spacer layer composed of an undoped GaN based compound semiconductor, the upper spacer layer being disposed between the active layer and the superlattice layer;

wherein the upper spacer layer has a thickness of 100 nm or less.

3. The GaN based semiconductor light-emitting device according to claim 1, wherein the superlattice layer has a thickness of 5 nm or more.

4. The GaN based semiconductor light-emitting device according to claim 1, wherein the superlattice of the superlattice layer has a period of two atomic layers to 20 nm.

5. The GaN based semiconductor light-emitting device according to claim 1, wherein the superlattice layer has a p-type doping concentration ranging from $1 \times 10^{18}/cm^3$ to $4 \times 10^{20}/cm^3$.

6. The GaN based semiconductor light-emitting device according to claim 1, wherein the underlying layer has a thickness of 20 nm or more.

7. The GaN based semiconductor light-emitting device according to claim 1, wherein the underlying layer contains an n-type dopant and has an n-type doping concentration ranging from $1 \times 10^{16}/cm^3$ to $1 \times 10^{21}/cm^3$.

8. The GaN based semiconductor light-emitting device according to claim 1, wherein an emission wavelength $\lambda$ ranges from about 430 nm to about 480 nm.

9. The GaN based semiconductor light-emitting device according to claim 1, wherein an emission wavelength $\lambda$ ranges from about 500 nm to about 550 nm.

10. The GaN based semiconductor light-emitting device according to claim 1, wherein operating current density is 50 A/cm$^2$ or more.

* * * * *